United States Patent
Che et al.

(10) Patent No.: US 12,399,813 B2
(45) Date of Patent: Aug. 26, 2025

(54) SENSE TIME SEPARATION IN FOGGY-FINE PROGRAM TO IMPROVE OPTIMAL VT WIDTH

(71) Applicant: Western Digital Technologies, Inc., San Jose, CA (US)

(72) Inventors: Xiaoyu Che, San Jose, CA (US); Guirong Liang, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 138 days.

(21) Appl. No.: 18/510,857

(22) Filed: Nov. 16, 2023

(65) Prior Publication Data
US 2025/0165385 A1  May 22, 2025

(51) Int. Cl.
*G11C 16/04* (2006.01)
*G06F 12/02* (2006.01)

(52) U.S. Cl.
CPC ................... *G06F 12/023* (2013.01)

(58) Field of Classification Search
CPC .................................................... G06F 12/023
See application file for complete search history.

(56) References Cited

U.S. PATENT DOCUMENTS

| | | | |
|---|---|---|---|
| 8,908,441 B1 | 12/2014 | Dutta et al. | |
| 9,478,293 B2 | 10/2016 | Yanagida et al. | |
| 10,394,649 B2 | 8/2019 | Alrod et al. | |
| 11,139,031 B1 | 10/2021 | Chen et al. | |
| 11,532,370 B1 | 12/2022 | Yang et al. | |
| 2024/0161831 A1* | 5/2024 | Jung | G11C 16/3459 |
| 2024/0212767 A1* | 6/2024 | Prakash | G11C 16/3459 |
| 2024/0304249 A1* | 9/2024 | Choi | G11C 16/10 |

* cited by examiner

*Primary Examiner* — Pho M Luu
(74) *Attorney, Agent, or Firm* — Dickinson Wright PLLC

(57) ABSTRACT

A memory device includes a plurality of memory cells and control circuitry configured to perform a foggy-fine programming operation in which memory cells are programmed in multiple programming passes. To perform the foggy-fine programming operation, the control circuitry is configured to perform a first pass of the foggy-fine programming operation on the memory cells, perform, in accordance with a first sense time, a first sensing operation on the memory cells programmed in the first pass of the foggy-fine programming operation, perform a second pass of the foggy-fine programming operation on the memory cells previously programmed in the first pass of the foggy-fine programming operation, and perform, in accordance with a second sense time, a second sensing operation on the memory cells programmed in the first pass and the second pass of the foggy-fine programming operation, wherein the second sense time is different from the first sense time.

20 Claims, 18 Drawing Sheets

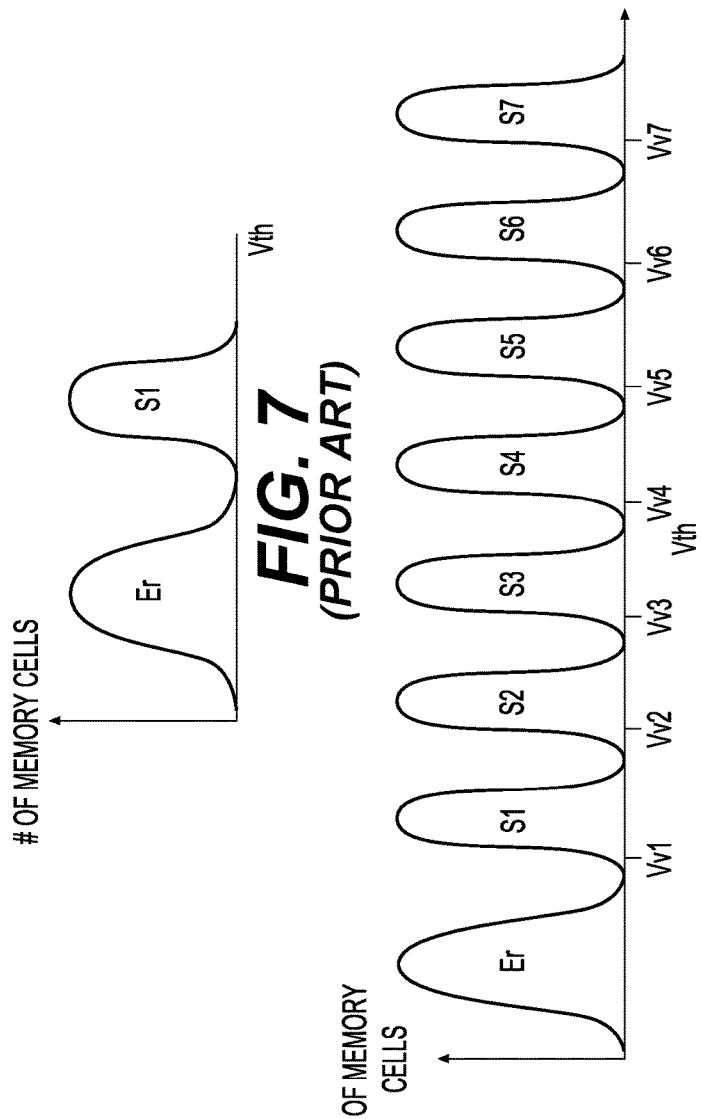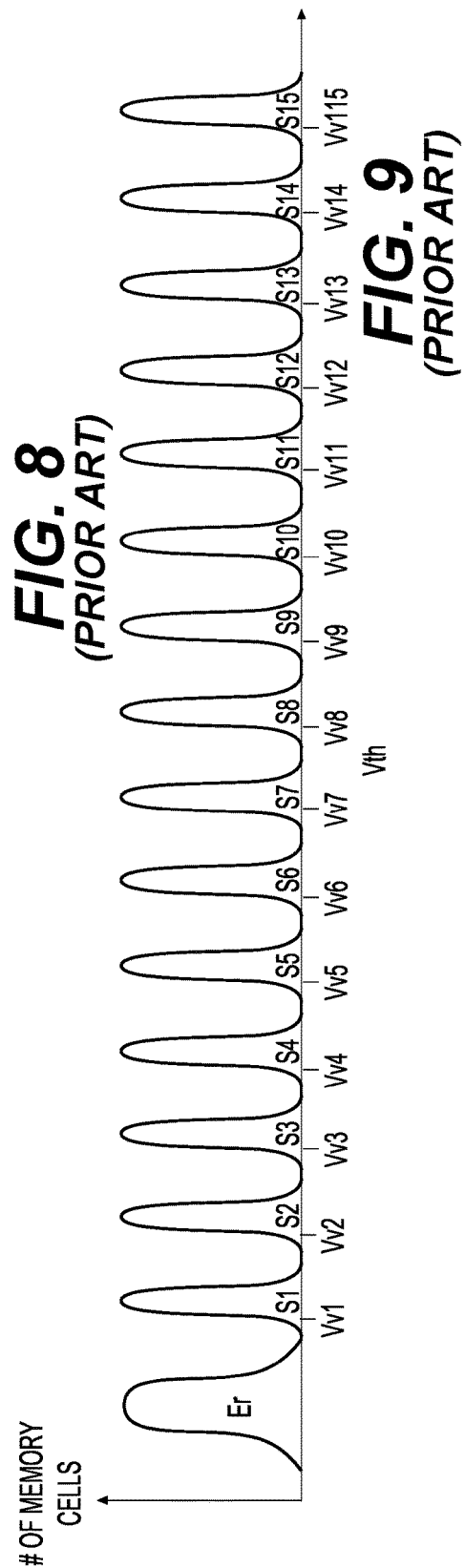

SENSE TIME SEPARATION IN FOGGY-FINE PROGRAM TO IMPROVE OPTIMAL VT WIDTH

BACKGROUND

1. Field

The present disclosure is related generally to programming techniques for memory cells in a memory device.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery. As one example, a NAND memory device includes a chip with a plurality of memory blocks, each of which includes an array of memory cells arranged in a plurality of word lines.

SUMMARY

A memory device includes a plurality of memory cells and control circuitry configured to perform a foggy-fine programming operation in which memory cells are programmed in multiple programming passes. To perform the foggy-fine programming operation, the control circuitry is configured to perform a first pass of the foggy-fine programming operation on the memory cells, perform, in accordance with a first sense time, a first sensing operation on the memory cells programmed in the first pass of the foggy-fine programming operation, perform a second pass of the foggy-fine programming operation on the memory cells previously programmed in the first pass of the foggy-fine programming operation, and perform, in accordance with a second sense time, a second sensing operation on the memory cells programmed in the first pass and the second pass of the foggy-fine programming operation. The second sense time is different from the first sense time.

In other features, the second sense time is longer than the first sense time. Performing the first sensing operation includes using the first sense time in a very low sense period of the first sensing operation and using a third sense time greater than the first sense time in a very high sense period of the first sensing operation. Performing the second sensing operation includes using the second sense time in a very low sense period of the second sensing operation and using a fourth sense time greater than the second sense time in a very high sense period of the second sensing operation. Each of the first, second, third, and fourth sense times are different. The first sense time is a sum of the second sense time and a negative offset value. The foggy-fine programming operation is a quad level cell (QLC) programming operation. Sense times used for different programmed states of the memory cells are different.

A method for operating a memory device including a plurality of memory cells includes performing a foggy-fine programming operation in which memory cells are programmed in multiple programming passes. Performing the foggy-fine programming operation includes performing a first pass of the foggy-fine programming operation on the memory cells, performing, in accordance with a first sense time, a first sensing operation on the memory cells programmed in the first pass of the foggy-fine programming operation, performing a second pass of the foggy-fine programming operation on the memory cells previously programmed in the first pass of the foggy-fine programming operation, and performing, in accordance with a second sense time, a second sensing operation on the memory cells programmed in the first pass and the second pass of the foggy-fine programming operation. The second sense time is different from the first sense time.

In other features, the second sense time is longer than the first sense time. Performing the first sensing operation includes using the first sense time in a very low sense period of the first sensing operation and using a third sense time greater than the first sense time in a very high sense period of the first sensing operation. Performing the second sensing operation includes using the second sense time in a very low sense period of the second sensing operation and using a fourth sense time greater than the second sense time in a very high sense period of the second sensing operation. Each of the first, second, third, and fourth sense times are different. The first sense time is a sum of the second sense time and a negative offset value. The foggy-fine programming operation is a quad level cell (QLC) programming operation. Sense times used for different programmed states of the memory cells are different.

A memory device includes a plurality of memory cells and control means for performing a foggy-fine programming operation in which memory cells are programmed in multiple programming passes. To perform the foggy-fine programming operation, the control means performs a first pass of the foggy-fine programming operation on the memory cells, performs, in accordance with a first sense time, a first sensing operation on the memory cells programmed in the first pass of the foggy-fine programming operation, performs a second pass of the foggy-fine programming operation on the memory cells previously programmed in the first pass of the foggy-fine programming operation, and performs, in accordance with a second sense time, a second sensing operation on the memory cells programmed in the first pass and the second pass of the foggy-fine programming operation. The second sense time is different from the first sense time.

In other features, the second sense time is longer than the first sense time. Performing the first sensing operation includes using the first sense time in a very low sense period of the first sensing operation and using a third sense time greater than the first sense time in a very high sense period of the first sensing operation, and performing the second sensing operation includes using the second sense time in a very low sense period of the second sensing operation and using a fourth sense time greater than the second sense time in a very high sense period of the second sensing operation. Each of the first, second, third, and fourth sense times are different.

BRIEF DESCRIPTION OF THE DRAWINGS

These and other features and advantages of the present disclosure will become more readily appreciated when considered in connection with the following description of the presently preferred embodiments, appended claims and accompanying drawings, in which:

FIG. 7 depicts a threshold voltage distribution of a page of memory cells programmed to one bit per memory cell (SLC);

FIG. 8 depicts a threshold voltage distribution of a page of memory cells programmed to three bits per memory cell (TLC);

FIG. 9 depicts a threshold voltage distribution of a page of memory cells programmed to four bits per memory cell (QLC);

DESCRIPTION OF THE ENABLING EMBODIMENT

Figure 1:
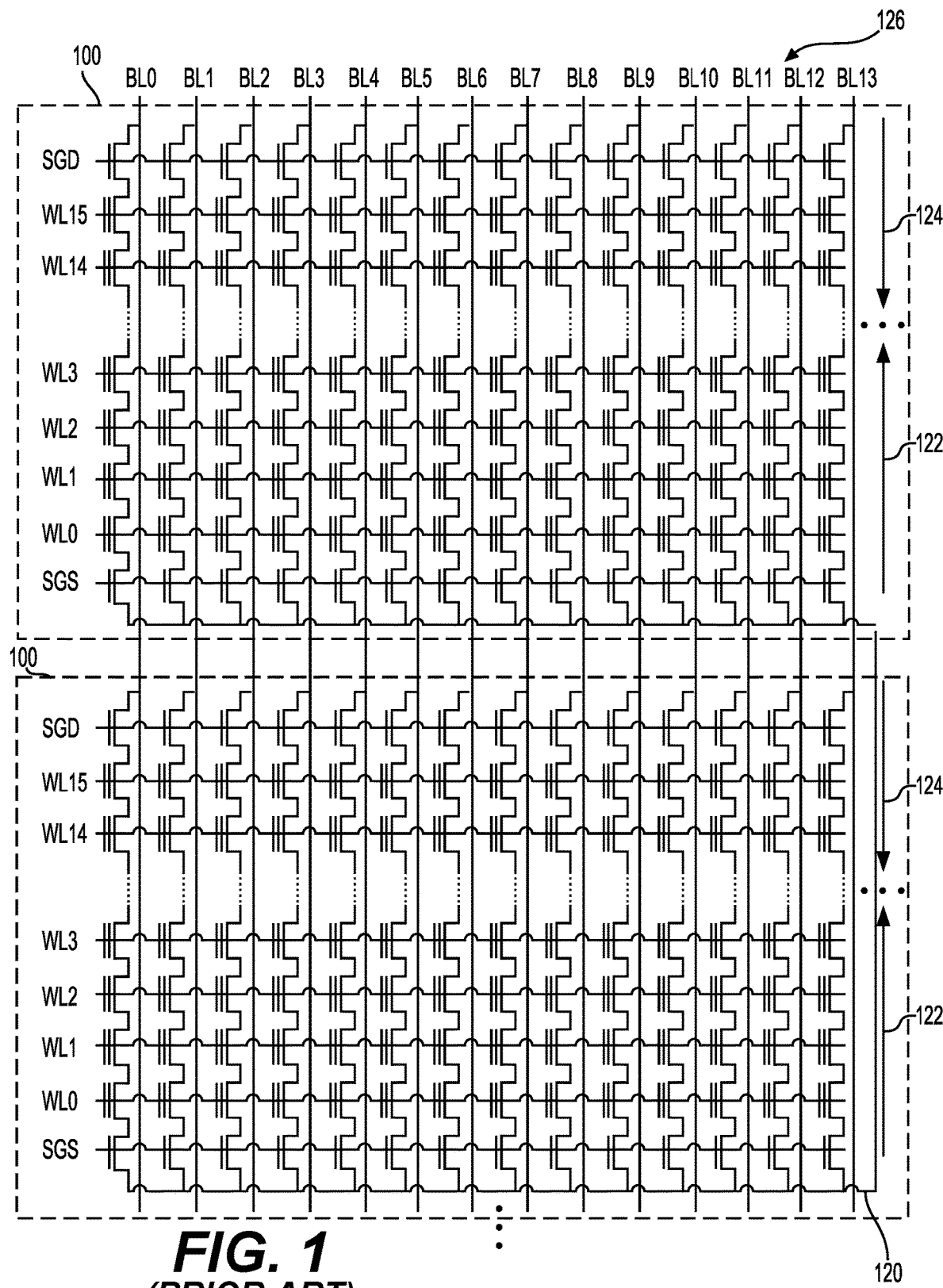
FIG. 1 depicts blocks of memory cells in an example two-dimensional configuration of a memory array.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed.

Programming of the memory cells of a selected word line WLn can be conducted in either a full sequence programming operation or a multi-pass programming operation. In a full sequence programming operation, the memory cells are programmed directly to their final threshold voltages in a single programming pass. In a multi-pass programming operation (e.g., a "foggy-fine programming operation"), the memory cells are programmed to their final programmed data states in two or more programming passes or stages, e.g., a first (also known as "foggy") pass and a second (also known as "fine") pass. The first pass and the second pass of the foggy-fine programming operation may be respective referred to as a foggy programming operation and a fine programming operation.

During a sensing operation for program-verify or read operations, including program-verify operations for a foggy-fine programming operation, a sense node SEN is charged to a predetermined charged voltage and then discharged. At a discharge time T_sense, a voltage on the sense node SEN is sensed and compared to a sense voltage V_sense to determine whether a threshold voltage Vt of the memory cell is above or below a reference voltage VCG.

Typically, the sensing operation for both the foggy programming operation and the fine programming operation use a same sense time ("SEN2"), and the sense time may be constant for different states of the memory cell. However, for programming operations of some types of memory cells (e.g., quad level cell (QLC) programming operations), optimal sense times for the foggy and fine programming operations may be different, which can cause Vt width degradation and other issues.

Foggy-fine programming systems and methods according to the present disclosure are configured to implement different sense times for foggy and fine programming operations, and/or different sense times for different states of a foggy-fine programming operation.

A pair of example memory blocks 100, 110 are illustrated in a FIG. 1. The memory blocks 100, 110 may be implemented in a system comprising a controller or control circuitry configured to implement foggy-fine programming techniques according to the present disclosure. In this example, the memory blocks 100, 110 have a two-dimensional configuration. A memory array in the chip can include many such blocks 100, 110. Each example block 100, 110 includes a number of NAND strings and respective bit lines, e.g., BL0, BL1, . . . which are shared among the blocks. Each NAND string is connected at one end to a drain-side select gate (SGD), and the control gates of the drain select gates are connected, in some examples, via a common SGD line. The NAND strings are connected at their other end to a source-side select gate (SGS) which, in turn, is connected to a common source line 120. One hundred and twelve word lines (WL0-WL111), for example, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 2A:
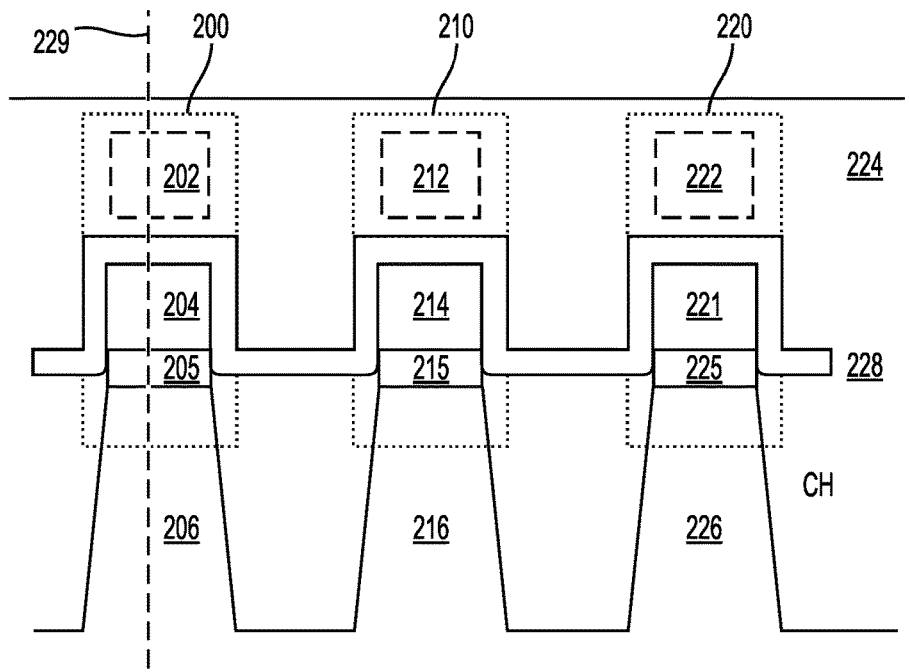
FIG. 2A and FIG. 2B depict cross-sectional views of example floating gate memory cells in NAND strings.
Figure 2B:
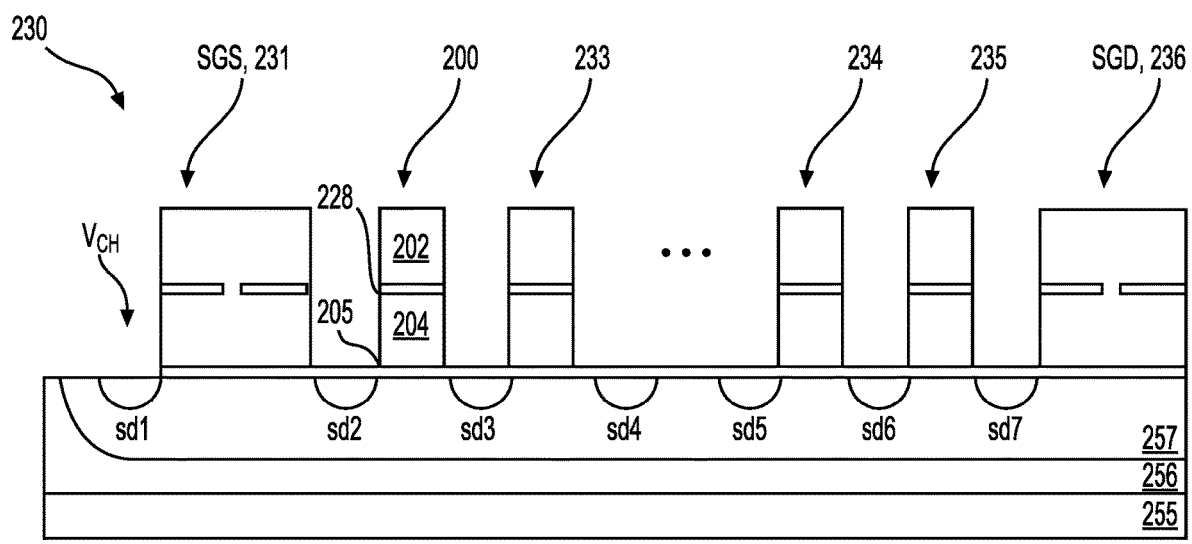

One type of non-volatile memory which may be provided in the memory array is a floating gate memory, such as of the type shown in FIGS. 2A and 2B. However, other types of non-volatile memory can also be used. As discussed in further detail below, in another example shown in FIGS. 3A and 3B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the cell channel into the nitride, where they are trapped and stored in a limited region. This stored charge then changes the threshold voltage Vt of a portion of the channel of the cell in a manner that is detectable. The memory cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known.

FIG. 2A illustrates a cross-sectional view of example floating gate memory cells 200, 210, 220 in NAND strings. In this Figure, a bit line or NAND string direction goes into the page, and a word line direction goes from left to right. As an example, word line 224 extends across NAND strings which include respective channel regions 206, 216 and 226. The memory cell 200 includes a control gate 202, a floating gate 204, a tunnel oxide layer 205 and the channel region 206. The memory cell 210 includes a control gate 212, a floating gate 214, a tunnel oxide layer 215 and the channel region 216. The memory cell 220 includes a control gate 222, a floating gate 221, a tunnel oxide layer 225 and the channel region 226. Each memory cell 200, 210, 220 is in a different respective NAND string. An inter-poly dielectric (IPD) layer 228 is also illustrated. The control gates 202, 212, 222 are portions of the word line. A cross-sectional view along contact line connector 229 is provided in FIG. 2B.

The control gate 202, 212, 222 wraps around the floating gate 204, 214, 221, increasing the surface contact area between the control gate 202, 212, 222 and floating gate 204, 214, 221. This results in higher IPD capacitance, leading to a higher coupling ratio which makes programming and erase easier. However, as NAND memory devices are scaled down, the spacing between neighboring cells 200, 210, 220 becomes smaller so there is almost no space for the control gate 202, 212, 222 and the IPD layer 228 between two adjacent floating gates 202, 212, 222.

Figure 3A:
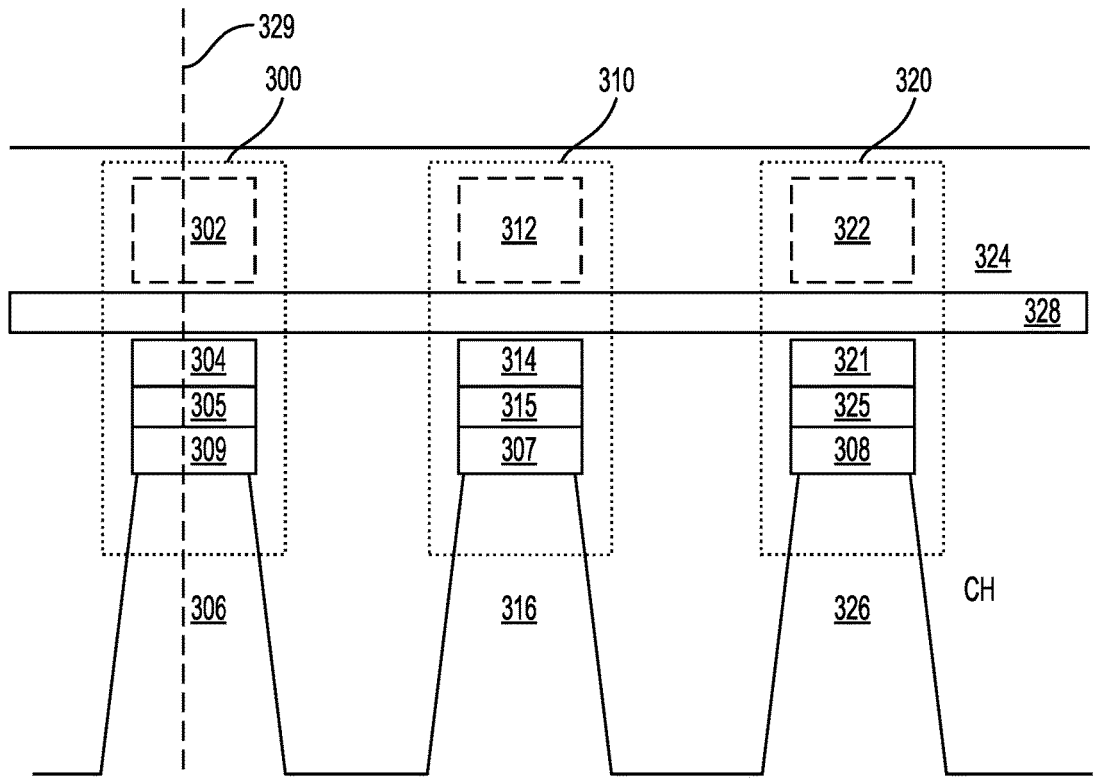
FIG. 3A and FIG. 3B depict cross-sectional views of example charge-trapping memory cells in NAND strings.
Figure 3B:
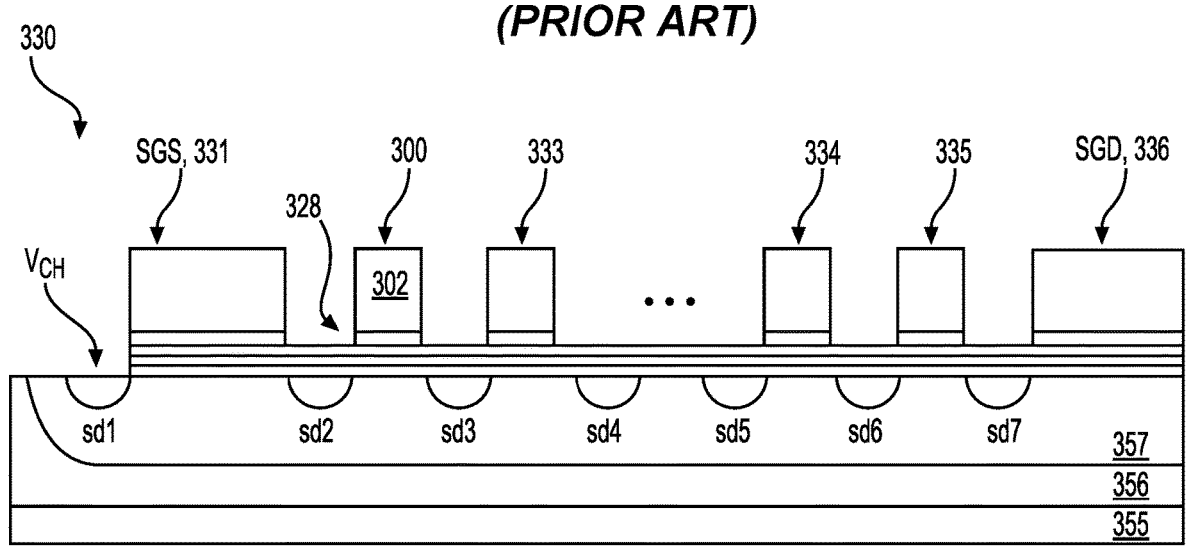

As an alternative, as shown in FIGS. 3A and 3B, the flat or planar memory cell 300, 310, 320 has been developed in which the control gate 302, 312, 322 is flat or planar; that is, it does not wrap around the floating gate and its only contact with the IPD layer 328 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 3A depicts a cross-sectional view of example charge-trapping memory cells 300, 310, 320 in NAND strings. The view is in a word line direction of memory cells 300, 310, 320 comprising a flat control gate and charge-trapping regions as a two-dimensional example of memory cells 300, 310, 320 in the memory cell array 126. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 324 extends across NAND strings which include respective channel regions 306, 316, 326. Portions of the word line provide control gates 302, 312, 322. Below the word line is an IPD layer 328, charge-trapping layers 304, 314, 321, polysilicon layers 305, 315, 325, and tunneling layers 309, 307, 308. Each charge-trapping layer 304, 314, 321 extends continuously in a respective NAND string. The flat configuration of the control gate can be made thinner than a floating gate. Additionally, the memory cells can be placed closer together.

FIG. 3B illustrates a cross-sectional view of the structure of FIG. 3A along contact line connector 329. The NAND string 330 includes an SGS transistor 331, example memory cells 300, 333, . . . 335, and an SGD transistor 336. Passageways in the IPD layer 328 in the SGS and SGD transistors 331, 336 allow the control gate layers 302 and floating gate layers to communicate. The control gate 302 and floating gate layers may be polysilicon and the tunnel oxide layer may be silicon oxide, for instance. The IPD layer 328 can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

Figure 4:
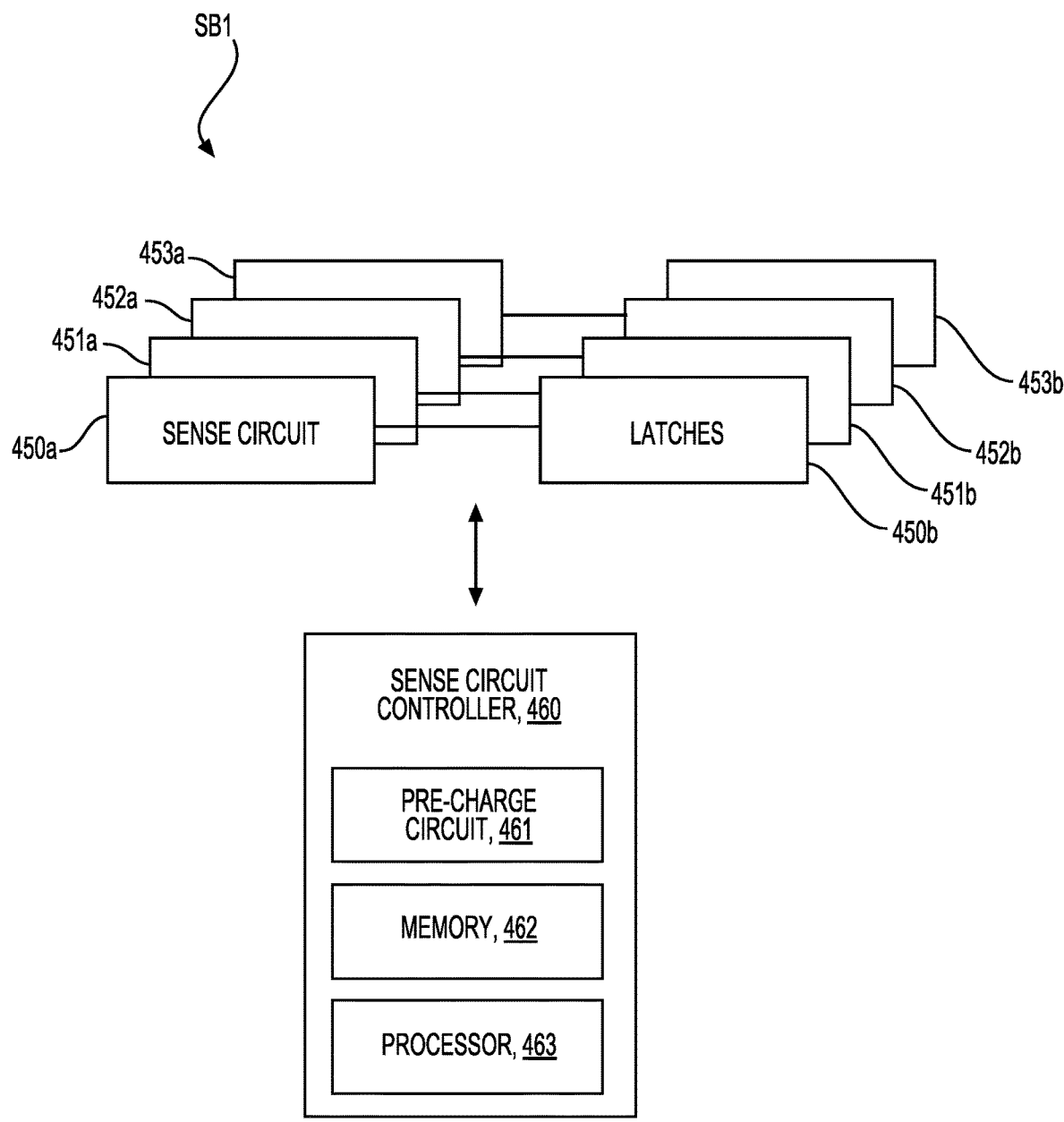
FIG. 4 depicts an example block diagram of a sense block SB1.

FIG. 4 illustrates an example block diagram of a sense block SB1 in a memory chip. In one approach, a sense block comprises multiple sense circuits. Each sense circuit is associated with data latches. For example, the example sense circuits 450a, 451a, 452a, and 453a are associated with the data latches 450b, 451b, 452b, and 453b, respectively. In one approach, different subsets of bit lines can be sensed using different respective sense blocks. This allows the processing load which is associated with the sense circuits to be divided up and handled by a respective processor in each sense block. For example, a sense circuit controller 460 in SB1 can communicate with the set of sense circuits and latches. The sense circuit controller 460 may include a pre-charge circuit 461 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 460 may also include a pre-charge circuit 461, a memory 462 and a processor 463. The memory 462 may store code which is executable by the processor to perform the functions described herein. These functions can include reading the latches 450b, 451b, 452b, 453b which are associated with the sense circuits 450a, 451a, 452a, 453a, setting bit values in the latches and providing voltages for setting pre-charge levels in sense nodes of the sense circuits 450a, 451a, 452a, 453a. Further example details of the sense circuit controller 460 and the sense circuits 450a, 451a, 452a, 453a are provided below. The sense circuit controller 460 may be configured to implement foggy-fine programming techniques for a program-verify operation according to the present disclosure as described below in more detail.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 5A:
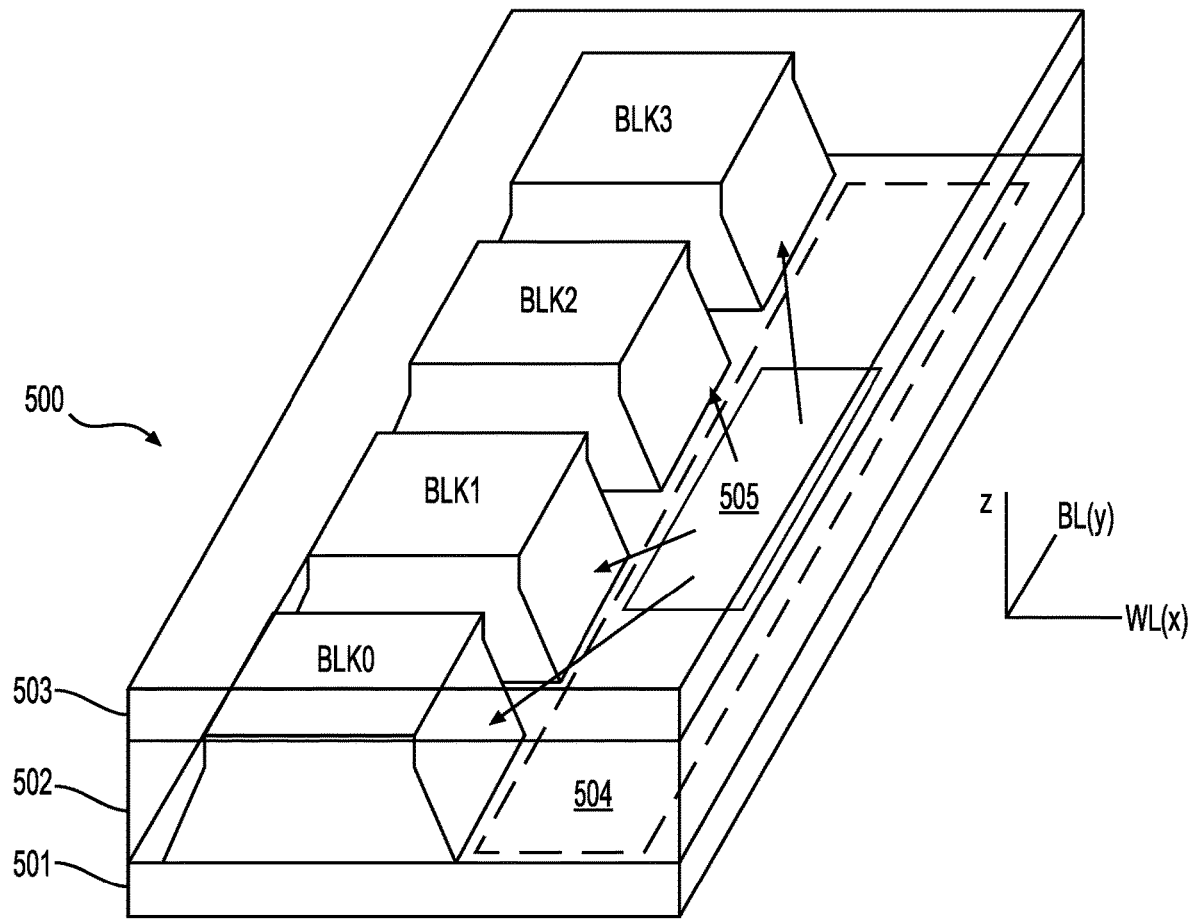
FIG. 5A is a perspective view of a set of blocks in an example three-dimensional configuration of a memory array.

FIG. 5A is a perspective view of a set of blocks 500 in an example three-dimensional configuration. On the substrate are example blocks BLK0, BLK1, BLK2, BLK3 of memory cells (storage elements) and a peripheral area 504 with circuitry for use by the blocks BLK0, BLK1, BLK2, BLK3. For example, the circuitry can include voltage drivers 505 which can be connected to control gate layers of the blocks BLK0, BLK1, BLK2, BLK3. In one approach, control gate layers at a common height in the blocks BLK0, BLK1, BLK2, BLK3 are commonly driven. The substrate 501 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 502 of the memory device. In an upper region 503 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 5B:
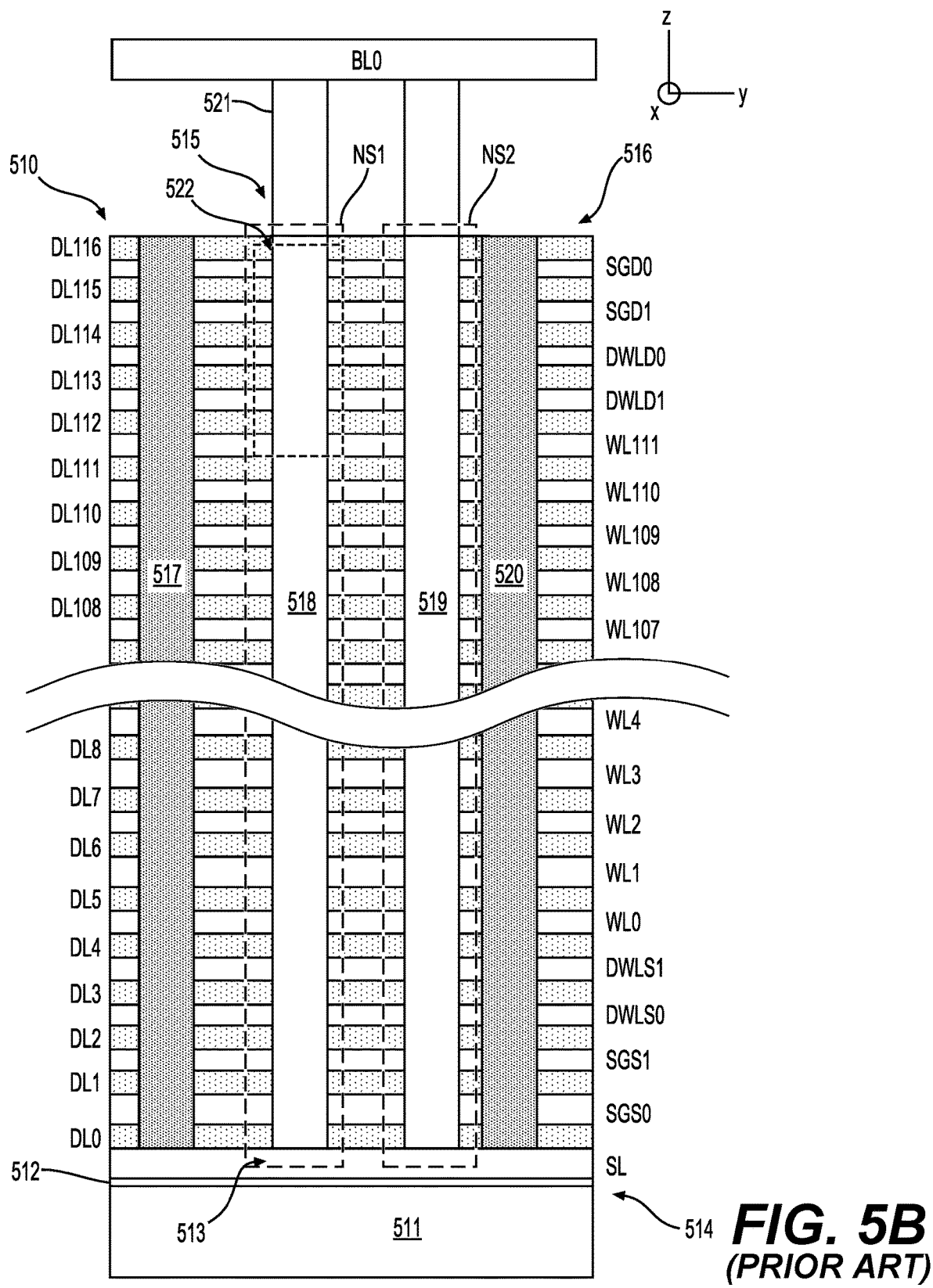
FIG. 5B depicts an example cross-sectional view of a portion of one of the blocks of FIG. 5A.

FIG. 5B illustrates an example cross-sectional view of a portion of one of the blocks BLK0, BLK1, BLK2, BLK3 of FIG. 5A. The block comprises a stack 510 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 510 which comprise NAND strings NS1 and NS2 are illustrated. Each NAND string encompasses a memory hole 518, 519 which is filled with materials which form memory cells adjacent to the word lines. A region 522 of the stack 510 is shown in greater detail in FIG. 5D and is discussed in further detail below.

The stack 510 includes a substrate 511, an insulating film 512 on the substrate 511, and a portion of a source line SL. NS1 has a source-end 513 at a bottom 514 of the stack and a drain-end 515 at a top 516 of the stack 510. Contact line connectors (e.g., slits, such as metal-filled slits) 517, 520 may be provided periodically across the stack 510 as interconnects which extend through the stack 510, such as to connect the source line to a particular contact line above the stack 510. The contact line connectors 517, 520 may be used during the formation of the word lines and subsequently filled with metal. A portion of a bit line BL0 is also illustrated. A conductive via 521 connects the drain-end 515 to BL0.

Figure 5C:
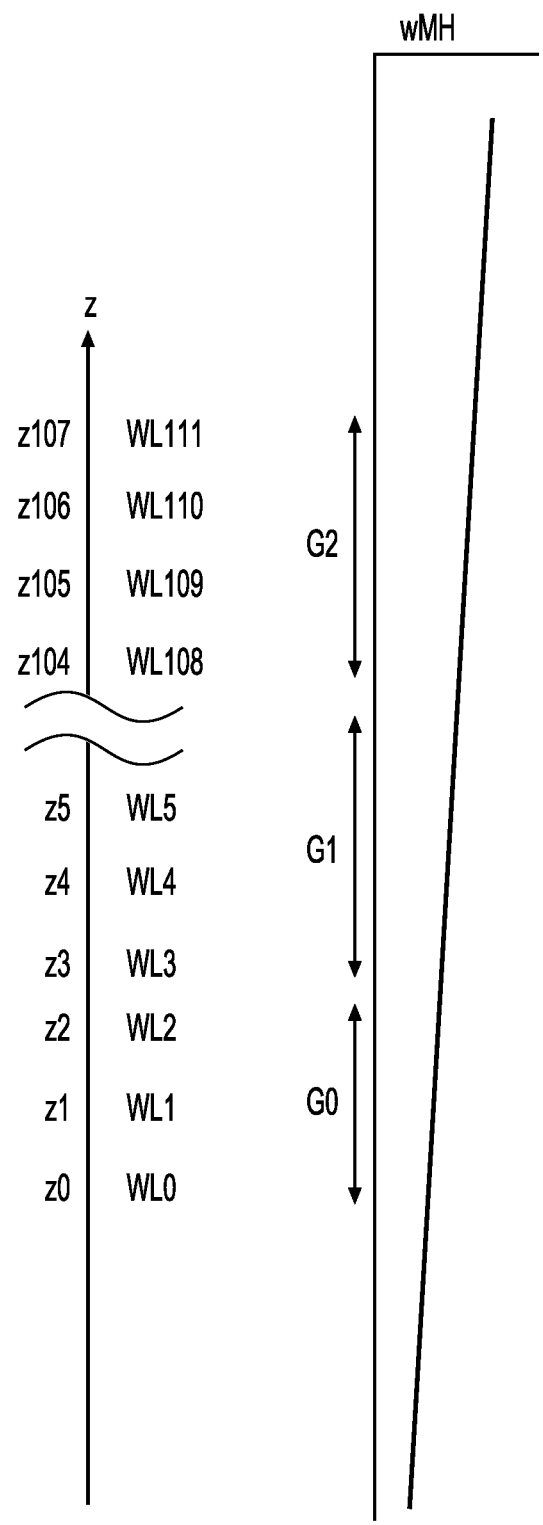
FIG. 5C depicts a plot of memory hole diameter of the stack of FIG. 5B.

FIG. 5C illustrates a plot of memory hole diameter in the stack of FIG. 5B. The vertical axis is aligned with the stack of FIG. 5B and illustrates a width (wMH), e.g., diameter, of the memory holes 518 and 519. The word line layers WL0-WL111 of FIG. 5A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Figure 5D:
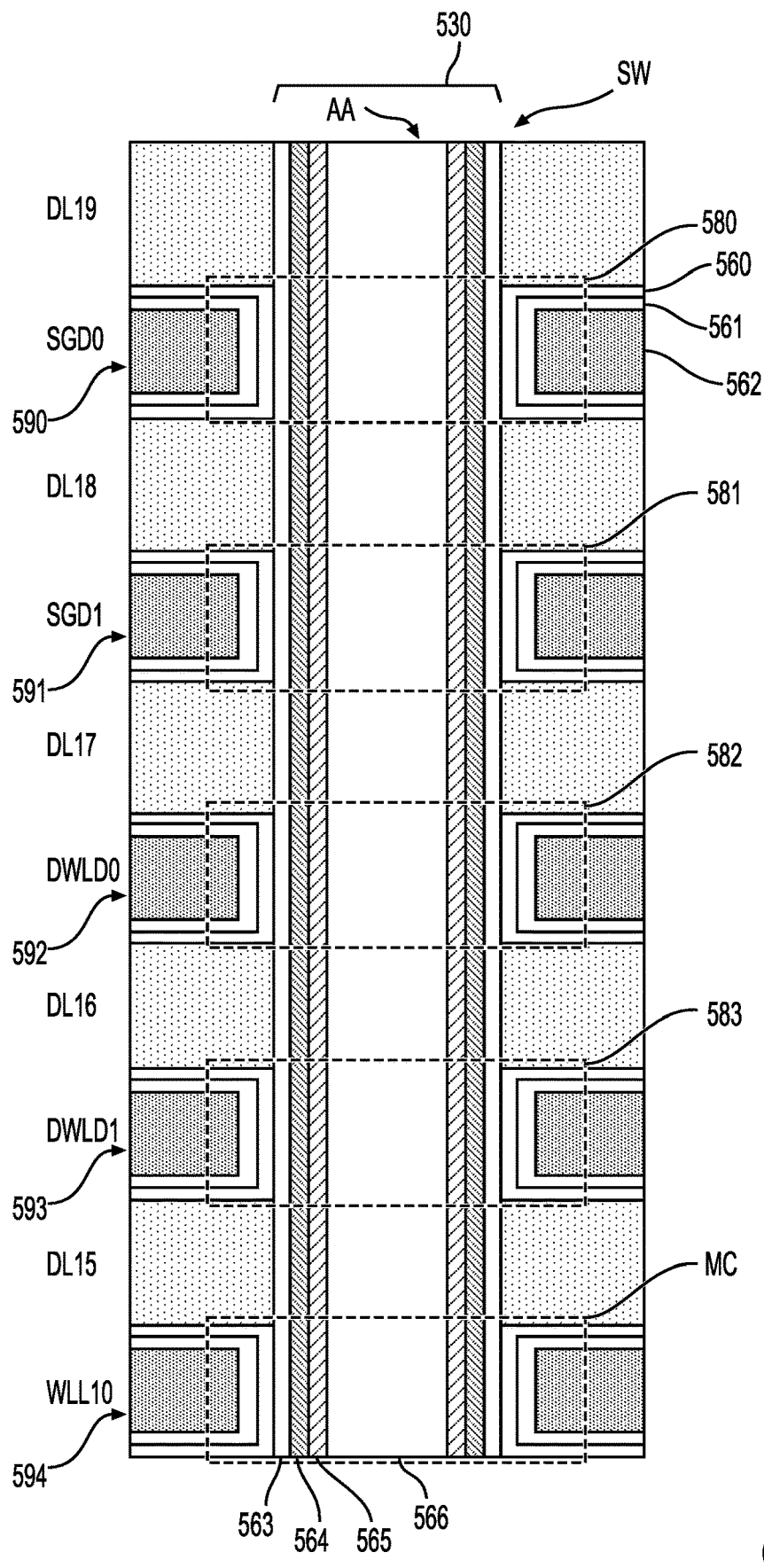
FIG. 5D depicts a close-up view of region 522 of the stack of FIG. 5B.

FIG. 5D illustrates a close-up view of the region 522 of the stack 510 of FIG. 5B. Memory cells are formed at the different levels of the stack at the intersection of a word line layer and a memory hole. In this example, SGD transistors 580, 581 are provided above dummy memory cells 582, 583 and a data memory cell MC. A number of layers can be deposited along the sidewall (SW) of the memory hole 530 and/or within each word line layer, e.g., using atomic layer deposition. For example, each column (e.g., the pillar which is formed by the materials within a memory hole 530) can include a charge-trapping layer or film 563 such as SiN or other nitride, a tunneling layer 564, a polysilicon body or channel 565, and a dielectric core 566. A word line layer can include a blocking oxide/block high-k material 560, a metal barrier 561, and a conductive metal 562 such as Tungsten as a control gate. For example, control gates 590, 591, 592, 593, and 594 are provided. In this example, all of the layers except the metal are provided in the memory hole 530. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the electrons return to the channel.

Each of the memory holes 530 can be filled with a plurality of annular layers comprising a blocking oxide layer, a charge trapping layer 563, a tunneling layer 564 and a channel layer. A core region of each of the memory holes 530 is filled with a body material, and the plurality of annular layers are between the core region and the word line in each of the memory holes 530.

The NAND string can be considered to have a floating body channel because the length of the channel is not formed on a substrate. Further, the NAND string is provided by a plurality of word line layers above one another in a stack, and separated from one another by dielectric layers.

Figure 6A:
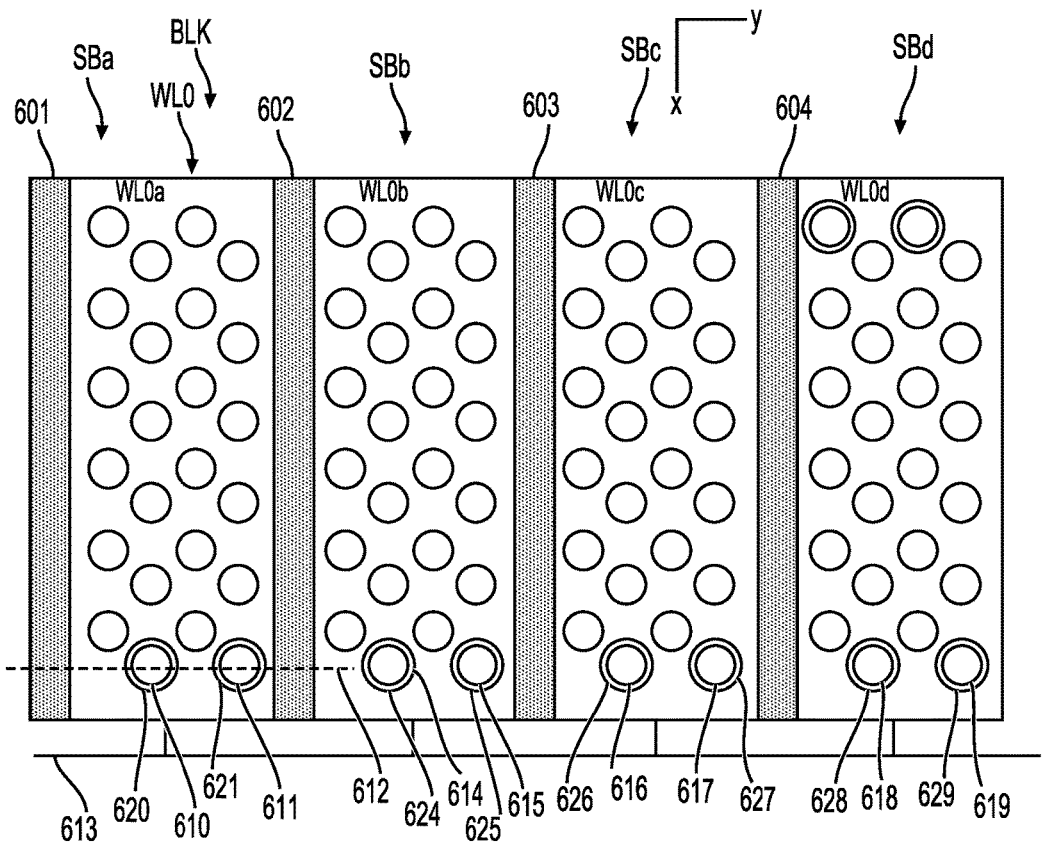
FIG. 6A depicts a top view of an example word line layer WL0 of the stack of FIG. 5B.

FIG. 6A illustrates a top view of an example word line layer WL0 of the stack 510 of FIG. 5B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 6B:
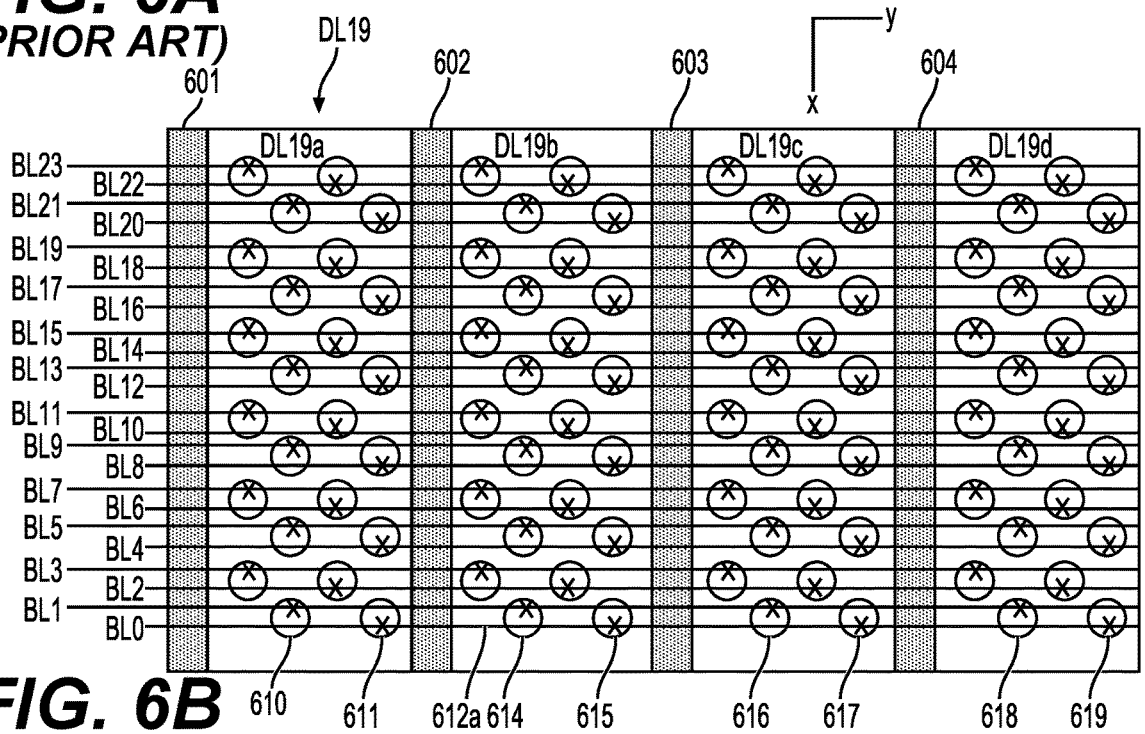
FIG. 6B depicts a top view of an example top dielectric layer DL116 of the stack of FIG. 5B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 613. The last region of a word line layer in a block can be connected to a first region of a word line layer in a next block, in one approach. The contact line 613, in turn, is connected to a voltage driver for the word line layer. The region WL0a has example memory holes 610, 611 along a contact line 612. The region WL0b has example memory holes 614, 615. The region WL0c has example memory holes 616, 617. The region WL0d has example memory holes 618, 619. The memory holes are also shown in FIG. 6B. Each memory hole can be part of a respective NAND string. For example, the memory holes 610, 614, 616 and 618 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 620, 621 are in WL0a, memory cells 624, 625 are in WL0b, memory cells 626, 627 are in WL0c, and memory cells 628, 629 are in WL0d. These memory cells are at a common height in the stack.

Contact line connectors (e.g., slits, such as metal-filled slits) 601, 602, 603, 604 may be located between and adjacent to the edges of the regions WL0a-WL0d. The contact line connectors 601, 602, 603, 604 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 6B illustrates a top view of an example top dielectric layer DL116 of the stack of FIG. 5B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 610, 611 along a contact line 612, which is coincident with a bit line BL0. A number of bit lines extend above the memory holes and are connected to the memory holes as indicated by the "X" symbols. BL0 is connected to a set of memory holes which includes the memory holes 611, 615, 617, 619. Another example bit line BL1 is connected to a set of memory holes which includes the memory holes 610, 614, 616, 618. The contact line connectors (e.g., slits, such as metal-filled slits) 601, 602, 603, 604 from FIG. 6A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The memory cells of the memory blocks can be programmed to retain one or more bits of data in multiple data states, each of which is associated with a respective threshold voltage Vt range. For example, FIG. 7 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 8 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. FIG. 9 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states. Generally, programming a fixed amount of data into memory cells at a higher number of bits per memory cell (such as TLC or QLC) requires more time than programming the same amount of data into more memory cells at a reduced number of bits per cell. In other words, there is a tradeoff between programming high speed (performance) and programming at high density. Also, programming to TLC or QLC stresses the memory cells more than programming to SLC, and therefore, the endurance (as measured in terabytes written [TBW]) of a memory device programming to SLC is generally greater than the endurance of a memory device programming to TLC or QLC.

Figure 10A:
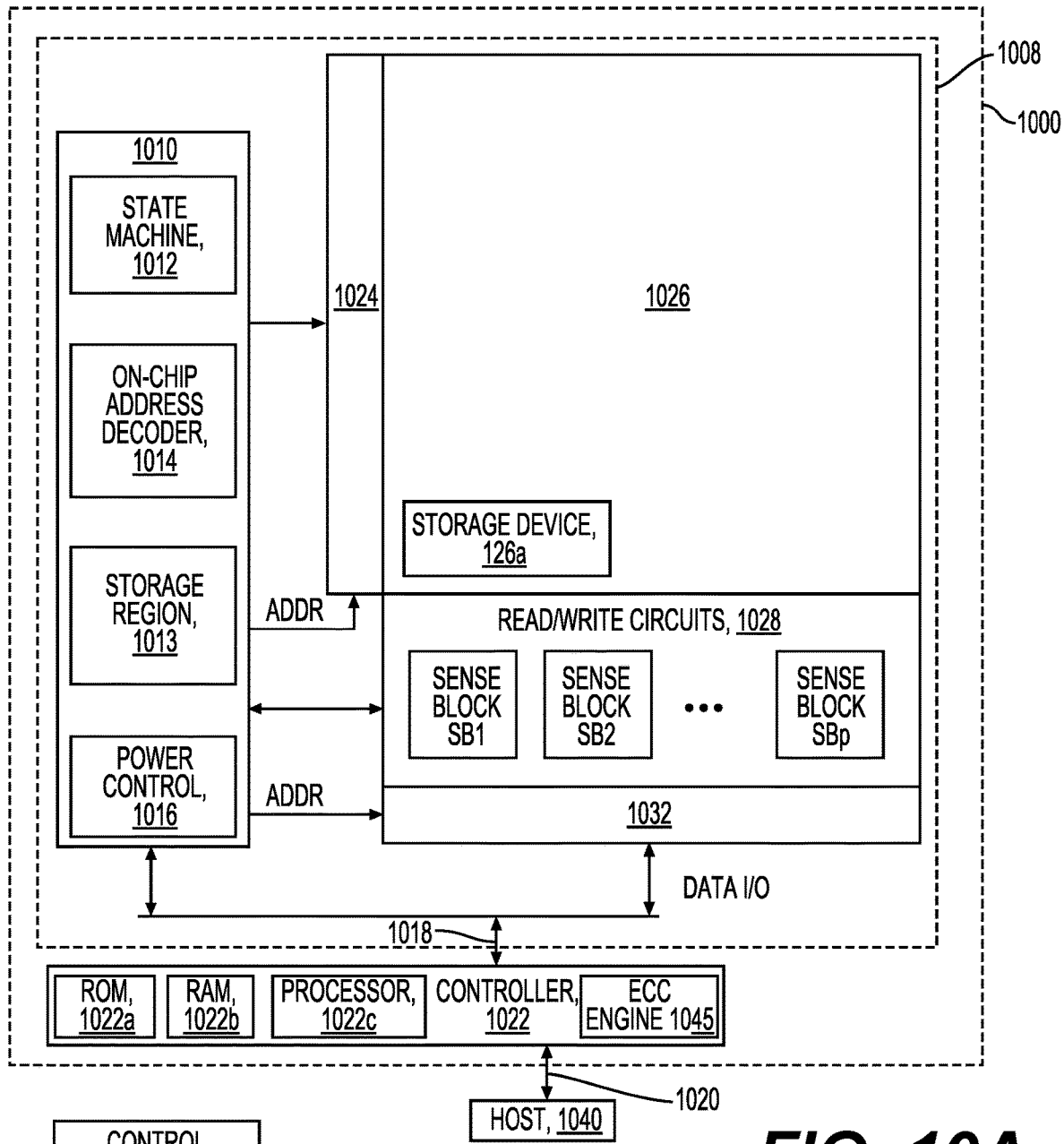
FIG. 10A is a block diagram of an example memory device.

FIG. 10A is a block diagram of an example memory device 1000 that is configured to operate according to the foggy-fine programming techniques of the present disclosure. The memory die 1008 includes a memory structure 1026 of memory cells arranged in word lines, such as an array of memory cells, control circuitry 1010, and read/write circuits 1028. The memory structure 1026 is addressable by word lines via a row decoder 1024 and by bit lines via a column decoder 1032. The read/write circuits 1028 include multiple sense blocks SB1, SB2, . . . SBp (sensing circuitry) and allow a page of memory cells to be read or programmed in parallel. A controller 1022 may be included in the same memory device 1000 (e.g., a removable storage card) as the one or more memory die 1008. Commands and data are transferred between the host 1040 and controller 1022 via a data bus 1020, and between the controller and the one or more memory die 1008 via lines 1018. In some examples, the controller 1022 is configured to perform all or portions of the foggy-fine programming operation of the present disclosure. Control circuitry 1010 may also be configured to perform all or portions of the foggy-fine programming operation of the present disclosure.

The memory structure 1026 can be two-dimensional or three-dimensional. The memory structure 1026 may comprise one or more array of memory cells including a three-dimensional array. The memory structure 1026 may comprise a monolithic three-dimensional memory structure in which multiple memory levels are formed above (and not in) a single substrate, such as a wafer, with no intervening substrates. The memory structure 1026 may comprise any type of non-volatile memory that is monolithically formed in one or more physical levels of arrays of memory cells having an active area disposed above a silicon substrate. The memory structure 1026 may be in a non-volatile memory device having circuitry associated with the operation of the memory cells, whether the associated circuitry is above or within the substrate.

The control circuitry 1010 cooperates with the read/write circuits 1028 to perform memory operations on the memory structure 1026, and includes a state machine 1012, an on-chip address decoder 1014, and a power control module 1016. The state machine 1012 provides chip-level control of memory operations. As discussed in further detail below, the control circuitry 1010 is configured to operate the memory device 1000 according to foggy-fine programming techniques of the present disclosure.

Turning back to FIG. 10A, a storage region 1013 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 1014 provides an address interface that is used by the host or a memory controller to determine the hardware address used by the decoders 1024 and 1032. The power control module 1016 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 1026, can be thought of as at least one control circuit which is configured to perform the actions described herein. For example, a control circuit may include any one of, or a combination of, control circuitry 1010, state machine 1012, decoders 1014/1032, power control module 1016, sense blocks SBb, SB2, . . . , SBp, read/write circuits 1028, controller 1022, and so forth.

Figure 10B:
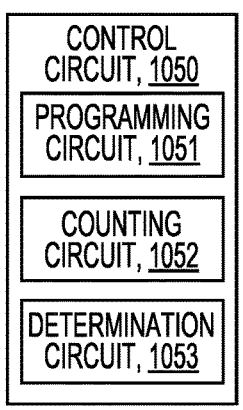
FIG. 10B is a block diagram of an example control circuit.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, whether a programming operation is completed. For example, FIG. 10B is a block diagram of an example control circuit 1050 which comprises a programming circuit 1051, a counting circuit 1052, and a determination circuit 1053. The control circuit 1050 may be configured to perform all or portions of the foggy-fine programming operation of the present disclosure.

The controller 1022 may comprise a processor 1022*c*, storage devices (memory) such as ROM 1022*a* and RAM 1022*b* and an error-correction code (ECC) engine 1045. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 1022*a*, 1022*b* comprise, code such as a set of instructions, and the processor 1022*c* is operable to execute the set of instructions to provide the functionality described herein. Alternately or additionally, the processor 1022*c* can access code from a storage device 1026*a* of the memory structure 1026, such as a reserved area of memory cells in one or more word lines. For example, code can be used by the controller 1022 to access the memory structure 1026 such as for programming, read, and erase operations. The code can include boot code and control code (e.g., set of instructions). The boot code is software that initializes the controller 1022 during a booting or startup process and enables the controller 1022 to access the memory structure 1026. The code can be used by the controller 1022 to control one or more memory structures 1026. Upon being powered up, the processor 1022*c* fetches the boot code from the ROM 1022*a* or storage device 1026*a* for execution, and the boot code initializes the system components and loads the control code into the RAM 1022*b*. Once the control code is loaded into the RAM 1022*b*, it is executed by the processor 1022*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

In other examples, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

The memory cells of a memory block are typically programmed by applying a voltage differential between a word line of a memory cell and a bit line coupled to the same memory cell, thereby causing electrons to tunnel into the floating gate of that memory cell and causing a threshold voltage of the memory cell to increase. Programming typically occurs sequentially from one word line to another across a memory block or sub-block. In other words, programming occurs with one word line at a time.

Programming of the memory cells of a selected word line WLn can be conducted in either a full sequence programming operation or a multi-pass programming operation. In a full sequence programming operation, the memory cells are programmed directly to their final threshold voltages in a single programming pass. In a multi-pass programming operation, the memory cells are programmed to their final programmed data states in two or more programming passes or stages, e.g., a first (also known as "foggy") pass or stage and a second (also known as "fine") pass or stage.

Figure 11:
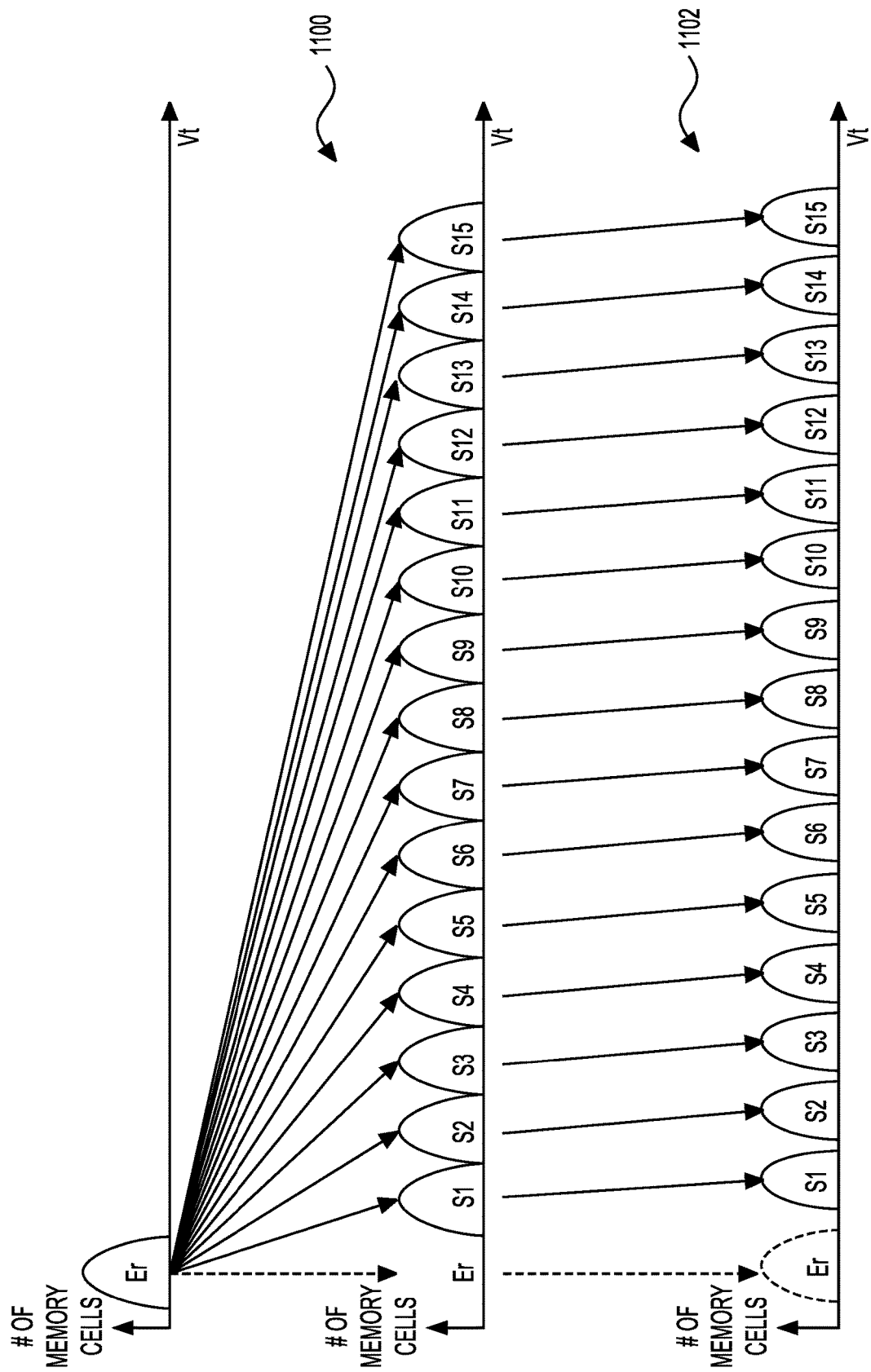
FIG. 11 depicts an example of a multi-pass programming operation to program memory cells to four bits of data per memory cell (QLC).

One example of a multi-pass programming operation to program the memory cells to four bits of data per memory cell (QLC) is schematically depicted in FIG. 11. In a first (foggy) pass 1100, the memory cells are programmed quickly (with a high programming voltage step size dVPGM between program loops) to approximately all of data states S1-S15, but each data state has a large or "fat" threshold voltage distribution. In a second (fine) pass 1102, the memory cells are programmed more slowly (with a smaller voltage step size dVPGM) and with higher accuracy to tighten the threshold voltage distributions and improve the reliability of the data. A similar technique can be employed when programming to TLC.

Figure 12:
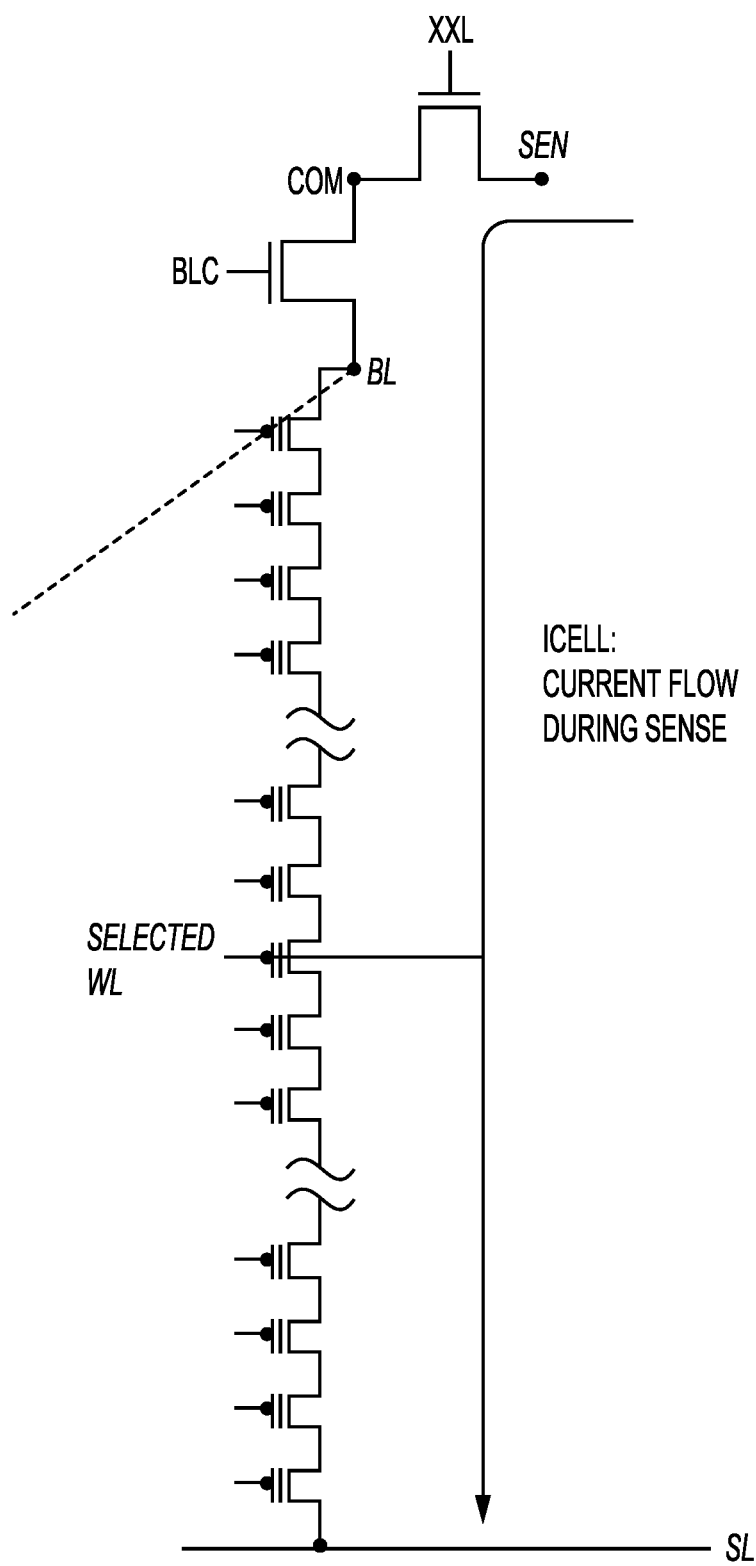
FIG. 12 is a schematic view illustrating an example NAND string during an example sensing operation.
Figure 13:
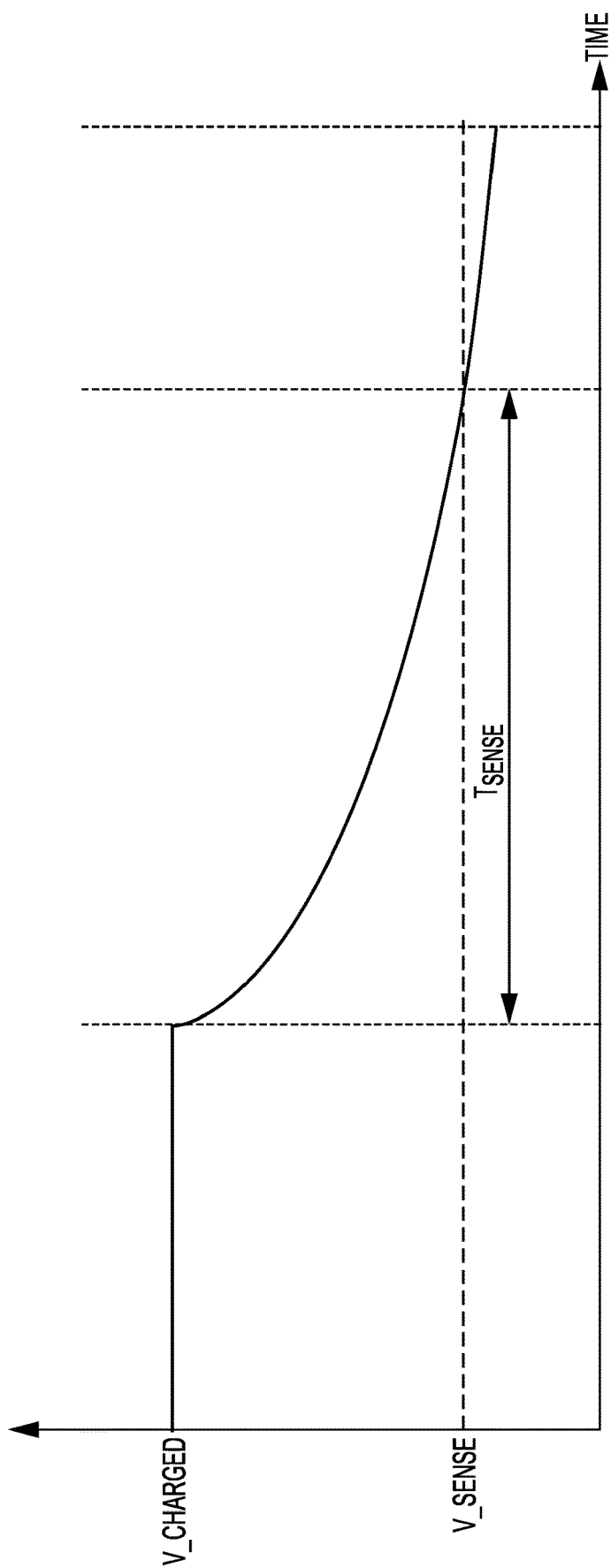
FIG. 13 is a plot illustrating the voltage of a sense node as it discharges during a sensing operation.
Figure 14:
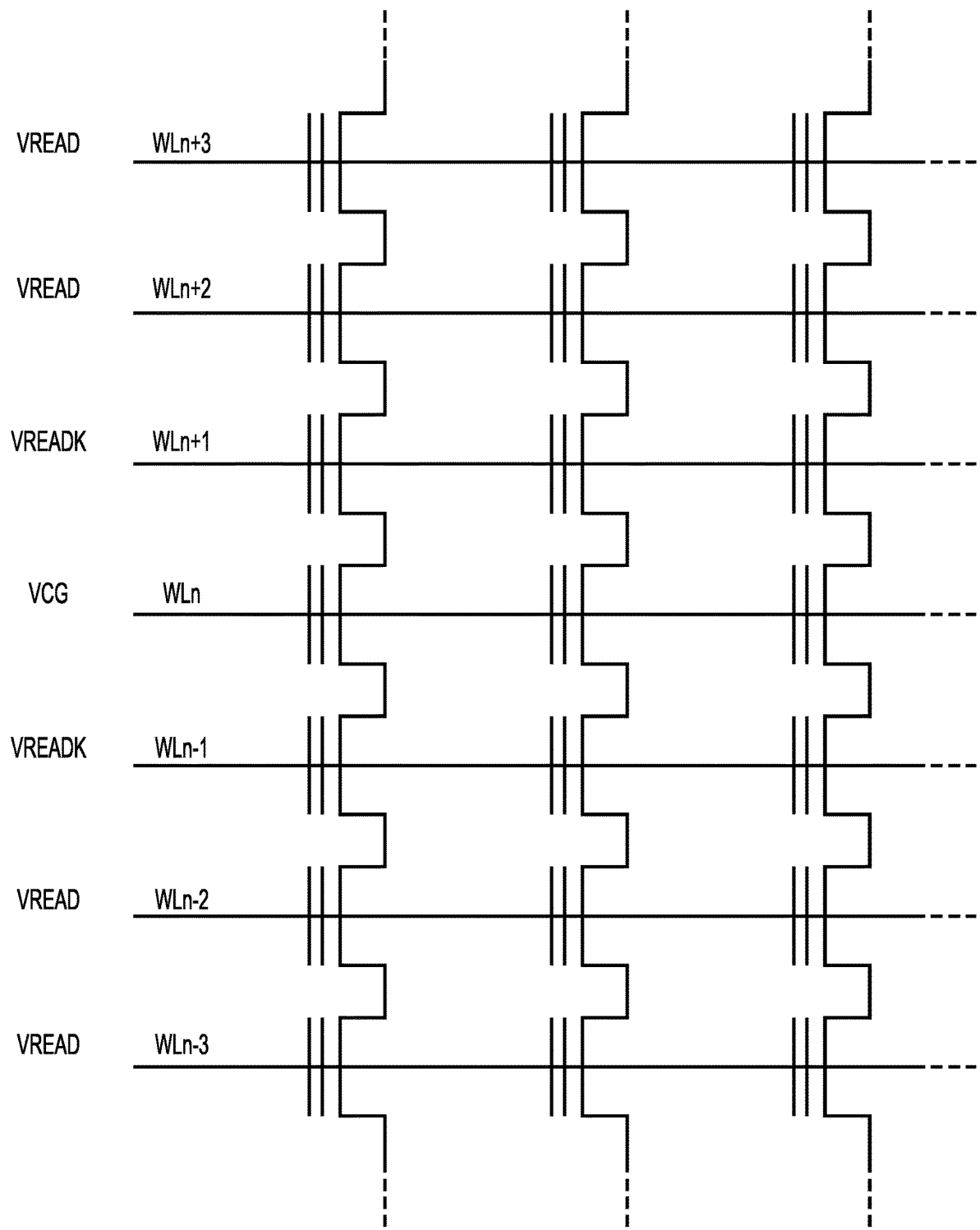
FIG. 14 is a schematic view of a portion of a memory block and illustrating the voltages applied to the word lines of the memory block during an example sensing operation.

With reference now to FIGS. 12-14, during a sensing operation (for example, program-verify or read, including program-verify operations for a foggy-fine programming operation), a sense node SEN on the drain side of the memory block is charged to a predetermined charged voltage. A reference voltage VCG is applied to a control gate of the selected word line. Simultaneously, all of the memory cells of the NAND string except the memory cell of the selected word line are "turned on" (made conductive) through the application of a pass voltage VREAD, VREADK. The pass voltage VREADK is applied to a pair of neighboring word lines WLn−1, WLn+1 that are directly adjacent the selected word line WLn, and the pass voltage VREAD is applied to all of the other unselected word lines in the memory block. The sense node SEN is then discharged through the NAND string (e.g., by opening a switch/transistor, such as a transistor XXL shown in FIG. 12). Since all of the memory cells except the one of the selected word line WLn are turned on, a discharge current through the NAND string is largely dictated by the threshold voltage Vt of the memory cell being sensed. More specifically, the discharge current is dictated by whether the threshold voltage Vt is greater than or less than the reference voltage VCG that is being applied to the selected word line WLn during this process.

At a discharge time T_sense, a voltage on the sense node SEN is sensed by the sensing circuitry and compared to a sense voltage V_sense, which is the threshold voltage Vt of the sensing transistor. If the threshold voltage Vt of the memory cell being sensed is higher than the reference voltage VCG, then the memory cell is "off" and conducts a very small/negligible current resulting in only a small discharge of SEN node voltage, thereby maintaining higher voltage on the sense node compared to V_sense. If the threshold voltage Vt of the memory cell being sensed is lower than the reference voltage VCG, then the memory cell is "on" and conducts a larger discharging current resulting in the sense node bias being lower than V_sense. Through this process, it is determined if the threshold voltage Vt of the memory cell is above or below the reference voltage VCG.

For programming operations of some types of memory cells (e.g., QLC programming operations), optimal sense times for the foggy and fine programming operations may be different. While using the same sense time for foggy and fine programming operations may be suitable for programming some types of memory cells (e.g., for single level cell and tri-level cell programming), using the same sense time for programming other types of memory cells (e.g., QLC programming) can cause sense time deviation, non-optimal Vt width and Vt width degradation, and/or other issues. Foggy-fine programming systems and methods according to the present disclosure are configured to implement different sense times for foggy and fine programming operations, and/or different sense times for different states of a foggy-fine programming operation. Accordingly, optimal sense times are used in respective stages of the foggy-fine programming operation. In some examples, foggy-fine programming operations according to the principles of the present disclosure achieve a Vt margin of improvement of greater than or equal to 200 mV and may be implemented with both in-place programmed quad word (IQPW) and full-programmed quad word (FQPW) programming operations.

Figure 15A:
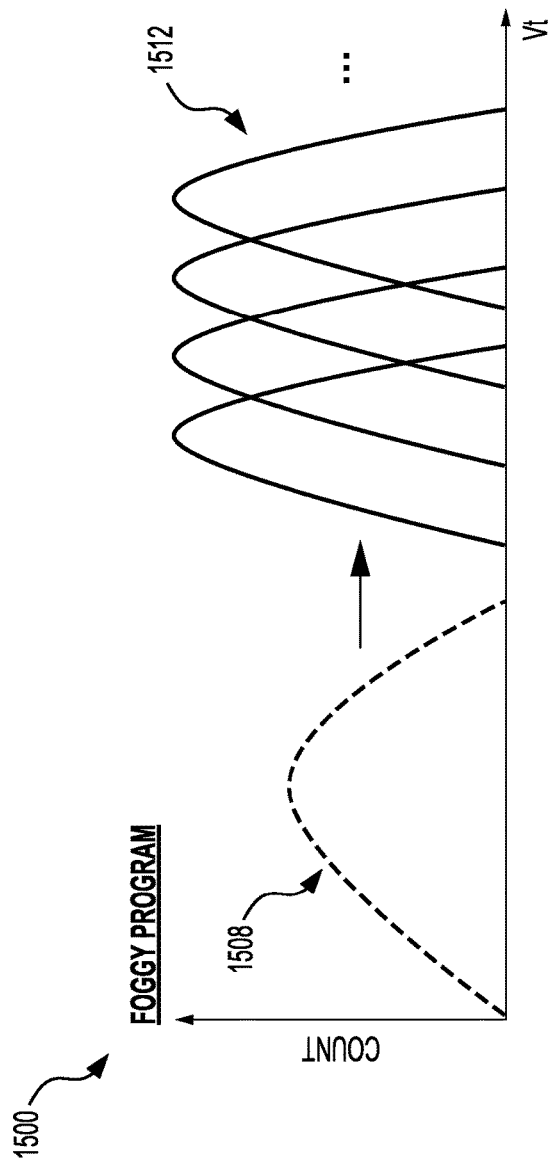
FIGS. 15A and 15B illustrate example Vt distributions for a foggy programming operation and a fine programming operation.
Figure 15B:

FIGS. 15A and 15B illustrate example Vt distributions for a foggy programming operation (shown at 1500) and a fine programming operation (shown at 1504). For example, the foggy programming operation starts with the memory cells having a relatively wide erased state (Er) Vt distribution as shown at 1508, resulting in a Vt distribution as shown at 1512. The foggy programming operation uses a relatively large step size (i.e., relative to the fine programming operation) and a linear program slope and results in an equilibrium stage. Conversely, the fine programming operation starts with the memory cells having the post-foggy programming operation Vt distribution (shown again at 1512 in FIG. 15B), resulting in a Vt distribution as shown at 1516. In other words, at the start of the fine programming operation, the memory cells have a narrower Vt distribution (as shown at 1512 in FIG. 15B) as compared to the start of the foggy programming operation (as shown at 1508 in FIG. 15A). The fine programming operation uses a relatively small step size (i.e., relative to the foggy programming operation) and a non-linear program slope and results in a non-equilibrium stage. For example, the pass write effect may cause the non-linear program slope of the fine programming operation.

Further, during fine programming of a word line (e.g., WLn as shown in FIG. 14), the foggy state in an adjacent word line (e.g., WLn+1) lowers the current ICELL (as shown in FIG. 12) through the memory cells, which may alter the outcome of the program-verify (PVFY) operation. For example, lower programming states typically pass PVFY with a higher ICELL and are sensitive to reduced ICELL, which may increase Vt width and shift optimal sense times. Accordingly, the pass write effect may be more pronounced as WLn+1 Vt increases, which causes an inversely proportional decrease in ICELL, and when the word line to be programmed (e.g., WLn in this example) is at a lower memory states that pass PVFY with higher ICELL.

Figure 16A:
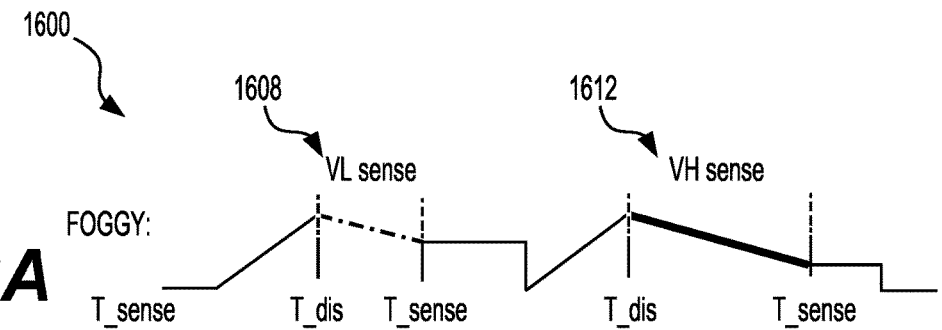
FIGS. 16A, 16B, 16C, and 16D show example sense times used for foggy programming operations and fine programming operations.
Figure 16B:
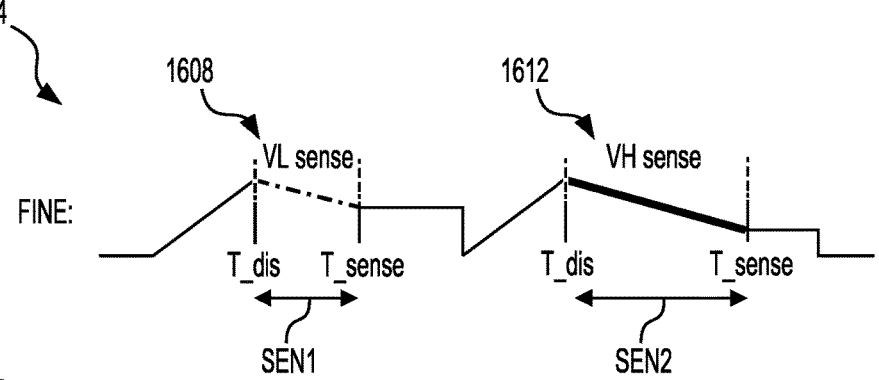

FIGS. 16A and 16B show example sense times used for a foggy programming operation (at 1600) and a fine programming operation (at 1604), for both a VL sense and a VH sense. In this example, while VL and VH sense times are different, the same sense time is used for both the foggy programming operation and the fine programming operation. As used herein, VL refers to a "very low sense" operation in which a lower voltage (e.g., 1V) is applied to the sense node as described above. Conversely, VH refers to a "very high sense" operation in which a higher voltage (e.g., 3V) is applied to the sense node.

As described above, a voltage on the sense node SEN is sensed at a discharge time T_sense. Accordingly, the sense time corresponds to a discharge period 1608, 1612 defined between a discharge time T_dis and the sense time T_sense. For example, during a sense operation, a transistor or switch is transitioned to an "ON" state at the time T_dis to allow the sense node SEN to discharge and start the discharge period 1608, 1612 and then transitioned to an "OFF" state end the discharge period 1608, 1612. In this manner, the discharge period 1608, 1612 corresponds to an amount of time required for the sense node SEN to discharge. However, due to the various differences between the foggy and fine programming operations and corresponding memory cell states described above, optimal sense times (i.e., lengths of the discharge periods 1608, 1612) may be different for the foggy and fine programming operations. For VH sense, the sense time may be referred to as SEN2. Conversely, for VL sense, the sense time may be referred to as SEN1, which may be defined as SEN2+DSEN1 (e.g., a negative offset value).

Figure 16C:
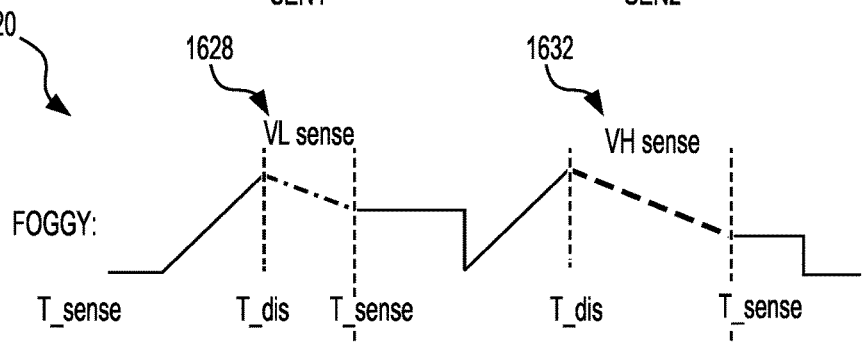
Figure 16D:
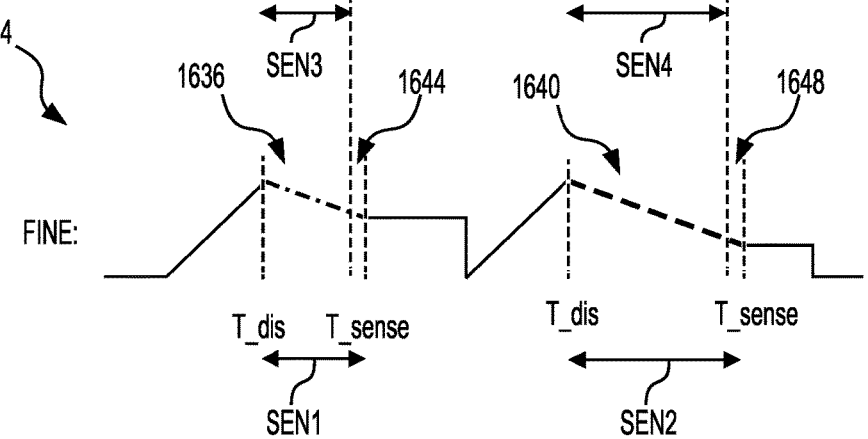

FIGS. 16C and 16D show example sense times used for a foggy programming operation (at 1620) and a fine programming operation (at 1624), for both a VL sense and a very high sense, according to the principles of the present disclosure. In this example, different sense times are used for the foggy programming operation and the fine programming operation. For example, as shown, sense times (and corresponding discharge periods 1628, 1632) for the foggy programming operation are shorter than sense times (and corresponding discharge periods 1636, 1640) for the fine programming operation. In other words, the sense times for the foggy and fine programming operations are offset from each other (e.g., by offsets 1644 and 1648, which may be same or different for VL and VH sense). For example only, the VL sense time and the VH sense time for the fine programming operation may be referred to as SEN1 and SEN2. Conversely, the VL sense time and VH sense time for the foggy programming operation may be referred to as SEN3 (e.g., defined as SEN2+DSEN1+OFF, which may be a negative offset value) and SEN4 (e.g., defined as SEN2+OFF).

Although, as shown in FIGS. 16C and 16D, the sense times and discharge periods 1636, 1640 are extended relative to the sense times and discharge periods 1628, 1632 by delaying the sense time T_sense, the sense times for the foggy and fine programming operations may be modified in another manner. For example, any of the times T_dis and T_sense for either of the foggy and fine programming operations may be moved forward or backward to modify respective sense times and discharge periods. In one example, a negative offset time is added to sense times for the VL and VH sense periods of the foggy programming operation, resulting in the sense times for the foggy programming operation being shorter than the sense times for the fine programing operation. In another example, a positive offset time is added to sense times for the VL and VH sense periods of the fine programming operation, resulting in the sense times for the fine programming operation being longer than the sense times for the foggy programing operation. As described herein, adding an offset or negative offset to a sense time may include adding a positive or negative offset to one or more of the times T_dis and T_sense for any component of the foggy and fine programming operations.

The offsets described above may be a tunable parameter and may be optimized depending on program step sizes of the respective foggy and fine programming operations. For example, the foggy programming operation may have a relatively larger step size, wider foggy Vt, and/or greater Vt difference between foggy and fine. Accordingly, the fine programming stage may start with a wider Vt distribution and therefore the pass write effect is less pronounced. In these cases, the difference between the optimal sense times of the foggy and fine programming operations is less and a smaller offset may be used. Conversely, in cases where the difference between the optimal sense times of the foggy and fine programming operations is greater, and a larger offset may be used.

As described above, sense times may be varied for foggy and fine programming operations. In another embodiment, sense times may be varied for sensing operations of different memory cell states. For example, for QLC, different states may have different optimal sense times due to being more or less susceptible to effects from ICELL increases or decreases. In some examples, lower states (e.g., programmed states S1, S2, S3, S4, etc.) may require less sense time than higher states (e.g., programmed states S11, S12, S13, S14, S15). Accordingly, the principles of the present disclosure described above with respect to using different sense times for foggy and fine programming operations may also be applied to using different sense times for different programmed states (e.g., by using different sense time offsets during corresponding sensing operations for different programmed states).

In one example, two sense times are used. For example, a first sense time is used for lower states (e.g., S1-S7) and a second sense time longer than the first sense time is used for higher states (e.g., S8-S15). In another example, three sense times may be used. For example, a first sense time is used for a lower states (e.g., S1-S4), a second sense time longer than the first sense time is used for intermediate states (e.g., S5-S10), and a third sense time longer than the second sense time is used for higher states (e.g., S11-S15). In still other examples, more than three sense times may be used (e.g., a different sense time for each state).

Different sense times according to the present disclosure may be used for different stages of a foggy-fine programming operation, different states of a single pass (i.e., full sequence) programming operation, and/or for different stages and different states of a foggy-fine programming operation.

Figure 17:
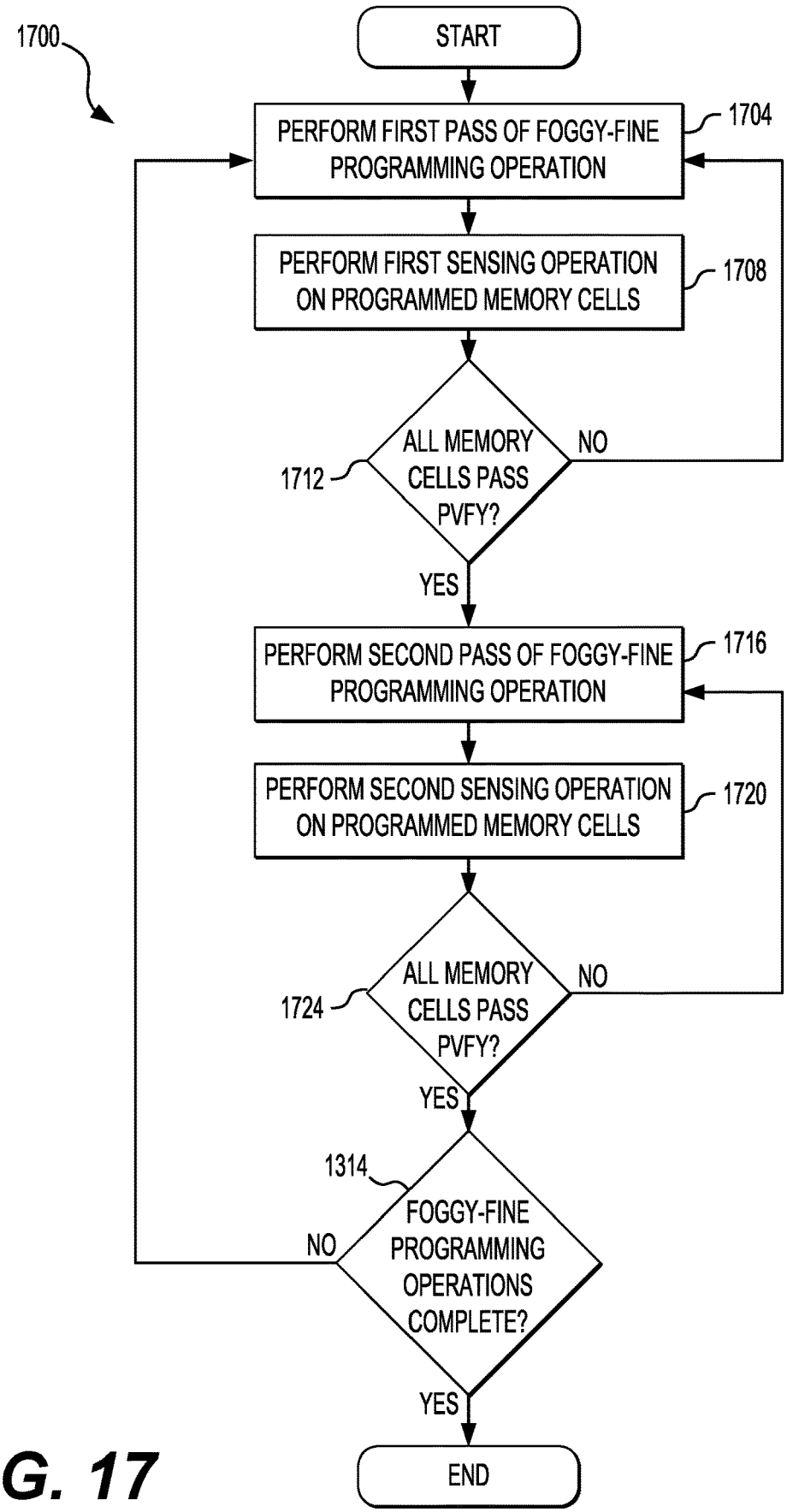
FIG. 17 illustrates steps of an example method 1700 for performing a sensing operation of a foggy-fine programming operation.

FIG. 17 illustrates steps of an example method 1700 for performing a sensing operation of a multi-pass (e.g., foggy-fine) programming operation according to the principles of the present disclosure. For example, one or more processors or processing devices are configured to execute instructions to implement the method 1700, such as one or more of the processors of the systems described herein. In an example, the method 1700 includes controlling sense circuits, such as the sense circuits described above in FIG. 4, using a sense circuit controller.

At 1704, a first pass (e.g., a foggy pass) of a foggy-fine programming operation is performed on selected memory cells as described above in FIG. 11. At 1708, a first sensing operation (e.g., a PVFY sensing operation) is performed on the programmed memory cells programmed in the first pass of the foggy-fine programming operation. For example, during the first sensing operation, the method 1700 senses a voltage on the sense node SEN as described above at one or more first sense times. At 1712, the method 1700 determines whether all of the programmed memory cells pass a PVFY operation. If true, the method 1700 continues to 1716. If false, the method 1700 continues to 1704 to repeat the first pass of the foggy-fine programming operation.

At 1716, a second pass (e.g., a fine pass) of the foggy-fine programming operation is performed on the selected memory cells. At 1720, a second sensing operation is performed on the programmed memory cells programmed in the second pass of the foggy-fine programming operation. For example, during the second sensing operation, the method 1700 senses the voltage on the sense node SEN as described above at one or more second sense times that are different from the one or more first sense times. At 1724, the method 1700 determines whether all of the programmed memory cells pass a PVFY operation. If true, the method 1700 continues to 1728. If false, the method 1700 continues to 1716 to repeat the second pass of the foggy-fine programming operation.

At 1728, the method 1700 determines whether the foggy-fine programming operation is complete. For example, the method 1700 determines whether all memory cells, word lines, memory blocks, etc. have been programmed. If true, the method 1700 ends. If false, the method 1700 continues to 1704 to continue to perform foggy-fine programming operations on additional memory cells.

Although described with respect to using different sense times for foggy and fine programming operations, the principles of the method 1700 may be implemented for different programmed states of respective memory cells. For example, for a sensing operation performed for a given memory cell or group of memory cells, two or more different sensing times may be used for different programmed states as described above, for both single-pass and multi-pass programming operations. In another example, the principles of the method 1700 may be implemented for both different programmed states and different passes/stages of a same foggy-fine programming operation. For example, for a foggy-fine programming operation, different sensing times may be used for both different programmed states and for different stages/passes.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

"A", "an", and "the" as used herein refers to both singular and plural referents unless the context clearly dictates otherwise. By way of example, "a processor" programmed to perform various functions refers to one processor programmed to perform each and every function, or more than one processor collectively programmed to perform each of the various functions.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory device, comprising:
   a plurality of memory cells; and
   control circuitry configured to perform a foggy-fine programming operation in which memory cells are programmed in multiple programming passes, wherein, to perform the foggy-fine programming operation, the control circuitry is configured to
      perform a first pass of the foggy-fine programming operation on the memory cells,
      perform, in accordance with a first sense time, a first sensing operation on the memory cells programmed in the first pass of the foggy-fine programming operation,
      perform a second pass of the foggy-fine programming operation on the memory cells previously programmed in the first pass of the foggy-fine programming operation, and
      perform, in accordance with a second sense time, a second sensing operation on the memory cells programmed in the first pass and the second pass of the foggy-fine programming operation, wherein the second sense time is different from the first sense time.

2. The memory device of claim 1, wherein the second sense time is longer than the first sense time.

3. The memory device of claim 1, wherein performing the first sensing operation includes using the first sense time in a very low sense period of the first sensing operation and using a third sense time greater than the first sense time in a very high sense period of the first sensing operation.

4. The memory device of claim 3, wherein performing the second sensing operation includes using the second sense time in a very low sense period of the second sensing operation and using a fourth sense time greater than the second sense time in a very high sense period of the second sensing operation.

5. The memory device of claim 4, wherein each of the first, second, third, and fourth sense times are different.

6. The memory device of claim 1, wherein the first sense time is a sum of the second sense time and a negative offset value.

7. The memory device of claim 1, wherein the foggy-fine programming operation is a quad level cell (QLC) programming operation.

8. The memory device of claim 7, wherein sense times used for different programmed states of the memory cells are different.

9. A method for operating a memory device including a plurality of memory cells, the method comprising:
   performing a foggy-fine programming operation in which memory cells are programmed in multiple programming passes, wherein performing the foggy-fine programming operation includes
      performing a first pass of the foggy-fine programming operation on the memory cells,
      performing, in accordance with a first sense time, a first sensing operation on the memory cells programmed in the first pass of the foggy-fine programming operation,
      performing a second pass of the foggy-fine programming operation on the memory cells previously programmed in the first pass of the foggy-fine programming operation, and
      performing, in accordance with a second sense time, a second sensing operation on the memory cells programmed in the first pass and the second pass of the foggy-fine programming operation, wherein the second sense time is different from the first sense time.

10. The method of claim 9, wherein the second sense time is longer than the first sense time.

11. The method of claim 9, wherein performing the first sensing operation includes using the first sense time in a very low sense period of the first sensing operation and using a third sense time greater than the first sense time in a very high sense period of the first sensing operation.

12. The method of claim 11, wherein performing the second sensing operation includes using the second sense time in a very low sense period of the second sensing operation and using a fourth sense time greater than the second sense time in a very high sense period of the second sensing operation.

13. The method of claim 12, wherein each of the first, second, third, and fourth sense times are different.

14. The method of claim 9, wherein the first sense time is a sum of the second sense time and a negative offset value.

15. The method of claim 9, wherein the foggy-fine programming operation is a quad level cell (QLC) programming operation.

16. The method of claim 15, wherein sense times used for different programmed states of the memory cells are different.

17. A memory device, comprising:
   a plurality of memory cells; and
   control means for performing a foggy-fine programming operation in which memory cells are programmed in multiple programming passes, wherein, to perform the foggy-fine programming operation, the control means
      performs a first pass of the foggy-fine programming operation on the memory cells,
      performs, in accordance with a first sense time, a first sensing operation on the memory cells programmed in the first pass of the foggy-fine programming operation,
      performs a second pass of the foggy-fine programming operation on the memory cells previously programmed in the first pass of the foggy-fine programming operation, and
      performs, in accordance with a second sense time, a second sensing operation on the memory cells programmed in the first pass and the second pass of the foggy-fine programming operation, wherein the second sense time is different from the first sense time.

18. The memory device of claim 17, wherein the second sense time is longer than the first sense time.

19. The memory device of claim 17, wherein performing the first sensing operation includes using the first sense time in a very low sense period of the first sensing operation and using a third sense time greater than the first sense time in a very high sense period of the first sensing operation, and wherein performing the second sensing operation includes using the second sense time in a very low sense period of the second sensing operation and using a fourth sense time greater than the second sense time in a very high sense period of the second sensing operation.

20. The memory device of claim 19, wherein each of the first, second, third, and fourth sense times are different.

* * * * *